US012772591B2

(12) United States Patent
Yang et al.

(10) Patent No.: US 12,772,591 B2

(45) Date of Patent: Oct. 20, 2026

(54) BOND STRUCTURES HAVING SHIELDING STRUCTURES FOR STACKED CHIPS

(71) Applicant: Taiwan Semiconductor Manufacturing Company, Ltd., Hsinchu (TW)

(72) Inventors: Hao-Lin Yang, Kaohsiung City (TW); Kuan-Chieh Huang, Hsinchu City (TW); Wei-Cheng Hsu, Kaohsiung City (TW); Tzu-Jui Wang, Fengshan City (TW); Chen-Jong Wang, Hsin-Chu (TW); Dun-Nian Yaung, Taipei City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 721 days.

(21) Appl. No.: 18/193,777

(22) Filed: Mar. 31, 2023

(65) Prior Publication Data

US 2024/0332333 A1 Oct. 3, 2024

(51) Int. Cl.

*H10F 39/00* (2025.01)
*H10W 72/90* (2026.01)
(Continued)

(52) U.S. Cl.

CPC ......... *H10F 39/809* (2025.01); *H10F 39/018* (2025.01); *H10W 72/967* (2026.01);
(Continued)

(58) Field of Classification Search

CPC .. H10F 39/809; H10F 39/018; H10W 72/967; H10W 80/312; H10W 80/327; H10W 90/792

See application file for complete search history.

(56) References Cited

U.S. PATENT DOCUMENTS

| | | | |
|---|---|---|---|
| 6,323,559 | B1 | 11/2001 | Chan et al. |
| 11,088,116 | B2 | 8/2021 | Wu et al. |

(Continued)

FOREIGN PATENT DOCUMENTS

| | | |
|---|---|---|
| JP | 2017022207 A | 1/2017 |

OTHER PUBLICATIONS

Non-Final Office Action dated Dec. 12, 2025 for U.S. Appl. No. 18/297,177.

(Continued)

*Primary Examiner* — Samuel A Gebremariam

(74) *Attorney, Agent, or Firm* — Eschweiler & Potashnik, LLC

(57) ABSTRACT

Various embodiments of the present disclosure are directed towards an integrated circuit (IC) including a first IC chip bonded to a second IC chip. The first chip IC includes a first bond structure. The first bond structure includes a first plurality of conductive bond pads and a first plurality of shield structures disposed between adjacent conductive bond pads among the first plurality of conductive bond pads. The second IC chip includes a second bond structure. A bonding interface is disposed between the first bond structure and the second bond structure. The second bond structure includes a second plurality of conductive bond pads and a second plurality of shield structures. The first plurality of conductive bond pads contacts the second plurality of conductive bond pads and the first plurality of shield structures contacts the second plurality of shield structures at the bonding interface.

20 Claims, 24 Drawing Sheets

(51) Int. Cl.
*H10W 80/00* (2026.01)
*H10W 90/00* (2026.01)

(52) U.S. Cl.
CPC ........ *H10W 80/312* (2026.01); *H10W 80/327* (2026.01); *H10W 90/792* (2026.01)

(56) References Cited

U.S. PATENT DOCUMENTS

| | | | |
|---|---|---|---|
| 11,133,346 B2 | 9/2021 | Madurawe et al. | |
| 11,393,781 B2 | 7/2022 | Watanabe | |
| 12,278,251 B2 | 4/2025 | Jang et al. | |
| 2013/0284885 A1 | 10/2013 | Chen et al. | |
| 2017/0221950 A1 | 8/2017 | Ho et al. | |
| 2019/0157333 A1 | 5/2019 | Tsai | |
| 2020/0035737 A1 | 1/2020 | Ito et al. | |
| 2020/0243473 A1 | 7/2020 | Wang et al. | |
| 2022/0199670 A1* | 6/2022 | Jang | H10F 39/8057 |
| 2023/0017688 A1 | 1/2023 | Lai et al. | |
| 2023/0039809 A1 | 2/2023 | Choi et al. | |

OTHER PUBLICATIONS

Get It 101. "Introduction to Camera Sensor 4T Structure" The date of publication is unknown. Retrieved online on Apr. 7, 2023 from https://www.getit01.com/p2018060144294l912.

Notice of Allowance dated May 5, 2026 for U.S. Appl. No. 18/297,177.

* cited by examiner

BOND STRUCTURES HAVING SHIELDING STRUCTURES FOR STACKED CHIPS

BACKGROUND

Many modern-day electronic devices (e.g., smartphones, digital cameras, biomedical imaging devices, automotive imaging devices, etc.) comprise image sensors. The image sensors comprise one or more photodetectors (e.g., photodiodes, phototransistors, photoresistors, etc.) configured to absorb incident radiation and output electrical signals corresponding to the incident radiation. Image sensors may comprise stacked chips to decrease a footprint of each pixel and increase device density.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
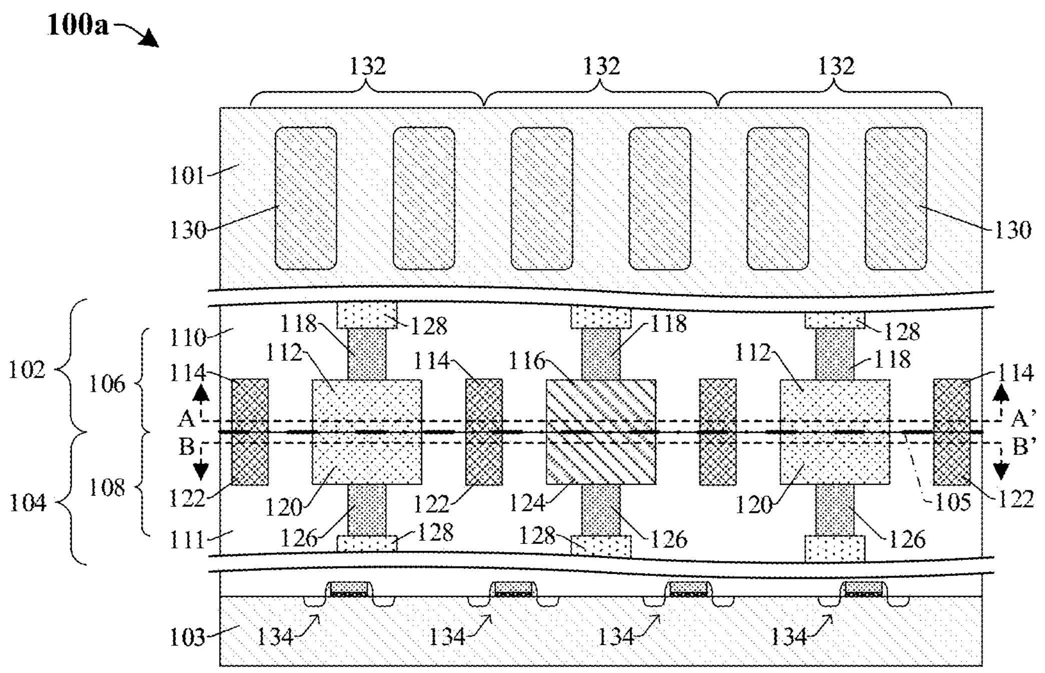
FIGS. 1A-1C illustrate various views of some embodiments of a stacked integrated circuit (IC) device comprising bond structures with shield structures.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A stacked complementary metal-oxide semiconductor (CMOS) image sensor may comprise a first integrated circuit (IC) chip and a second IC chip that are stacked. The first IC chip comprises a plurality of pixels arrange in a plurality of rows and a plurality of columns. The pixels comprise photodetectors and floating diffusion nodes disposed within a first substrate of the first IC chip. Further, transfer transistors are disposed on the first substrate and are each configured to transfer accumulated charge from the photodetectors to a corresponding floating diffusion node. The first IC chip further comprises a first bond structure including a first plurality of conductive bond pads. The second IC chip comprises a second bond structure comprising a second plurality of conductive bond pads contacting the first plurality of conductive bond pads at a bonding interface. The conductive bond pads of the first bond structure are respectively coupled to an individual pixel.

In an embodiment, a plurality of readout transistors individual to the pixels is disposed on the first substrate. The readout transistors comprise source-follower transistors, reset transistors, and select transistors which are configured to conduct readout of the photodetectors such that charge accumulated by the photodetectors from incident radiation may be readout as a corresponding electrical signal at an output of the readout transistors (e.g., at a source/drain terminal of the select transistor). An application specific integrated circuit (ASIC) is disposed on the second IC chip and comprises a plurality of semiconductor devices configured to receive the electrical signal from the readout transistors and perform image signal processing. The plurality of semiconductor devices are electrically coupled to the first IC chip by way of the second plurality of conductive bond pads.

During operation, the conductive bond pads of the first bond structure transfer electrical signals from the select transistors that correspond to magnitudes of charge accumulated by the photodetectors of each pixel on a column-by-column basis. For instance, photodetectors of a first pixel coupled to a first conductive bond pad in a first column is read, then photodetectors of a second pixel coupled to a second conductive bond pad in a second column is read, and so on. As a result of a close proximity of the conductive bond pads in the first plurality of conductive bond pads, there may be parasitic capacitance and/or parasitic inductance between adjacent conductive bond pads. The parasitic capacitance and/or parasitic inductance causes crosstalk between the adjacent conductive bond pads. The crosstalk increases as features of the image sensor are scaled down. This, in part, decreases an overall performance of the image sensor and degrades the accuracy of an image produced by the image sensor.

In another embodiment, in an effort to facilitate scaling of the pixels without reducing a size of the photodetectors, the plurality of readout transistors may be disposed on a second substrate of the second IC chip. In such an embodiment, floating diffusion node(s) of each pixel are directly electrically coupled to an individual conductive bond pad in the first plurality of conductive bond pads. The first plurality of conductive pads are configured to transfer accumulated charge from the photodetectors (e.g., by way of the floating diffusion node(s)) to gates of the plurality of source-follower transistors. However, the pixels are readout on a column-by-column basis and the conductive bond pads in the first plurality of conductive bond pads have a close proximity, such that crosstalk (e.g., due to parasitic capacitance and/or inductance) may occur between the adjacent conductive bond pads. As a result, an overall performance of the image sensor is decreased.

Accordingly, various embodiments of the present application are directed towards a stacked IC device having bond structures configured to reduce signal interference between adjacent conductive bond pads. The stacked IC device comprises a first IC chip stacked with a second IC chip. A plurality of pixels is disposed on the first IC chip and comprises a plurality of photodetectors disposed in a first substrate of the first IC chip. A first bond structure comprising a first plurality of conductive bond pads is disposed on the first substrate and coupled to components and/or structures of the pixels. The first plurality of conductive bond pads is bonded to a second bond structure of the second IC chip, where the second bond structure comprises a second plurality of conductive bond pads. Further, the first and second bond structures respectively comprise a first plurality of shield structures and a second plurality of shield structures.

The shield structures of the first bond structure are disposed between adjacent conductive bond pads of the first plurality of conductive bond pads, and the shield structures of the second bond structure are disposed between adjacent conductive bond pads of the second plurality of conductive bond pads. The first and second pluralities of shield structures mitigate signal interference between adjacent conductive bond pads (e.g., by blocking and/or obstructing electromagnetic fields between the adjacent conductive bond pads), thereby reducing parasitic capacitance and inductance between conductive bond pads of the first and second bond structures. As a result, crosstalk between adjacent conductive bond pads is reduced. Accordingly, device features of the stacked IC device may be scaled while increasing an overall performance of the stacked IC device (e.g., increasing accuracy of an image produced by the stacked IC device).

Figure 1B:
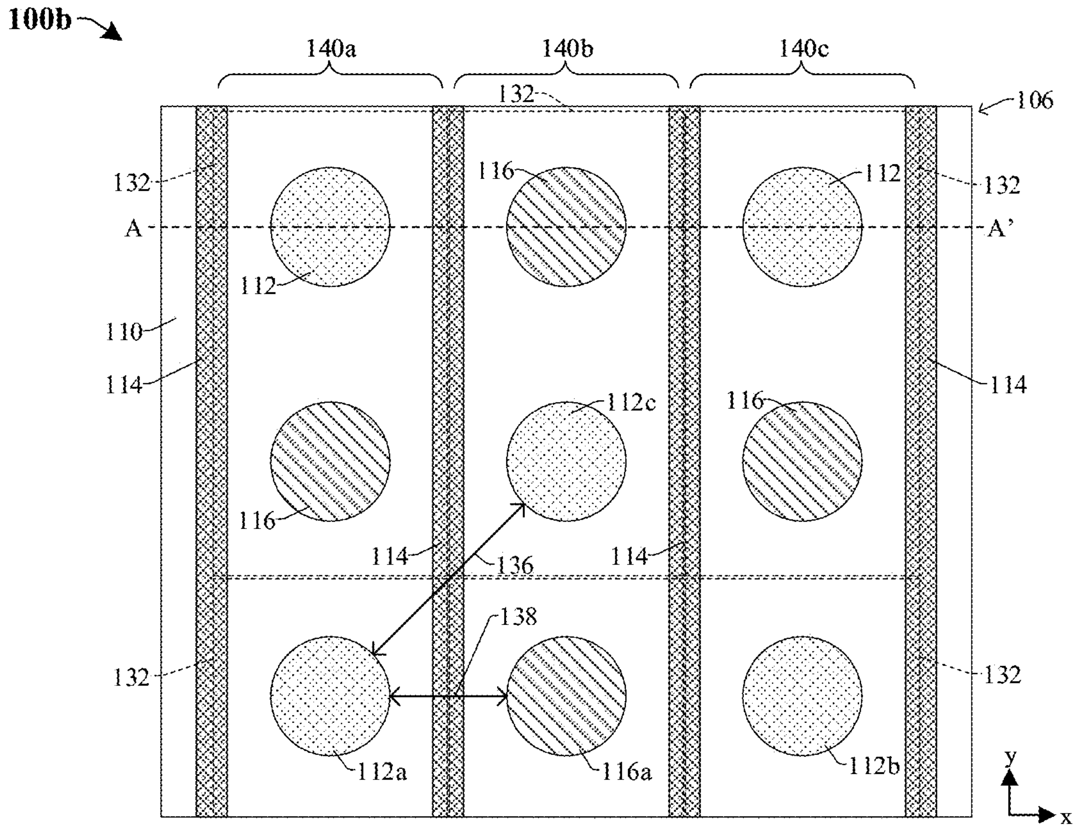
Figure 1C:
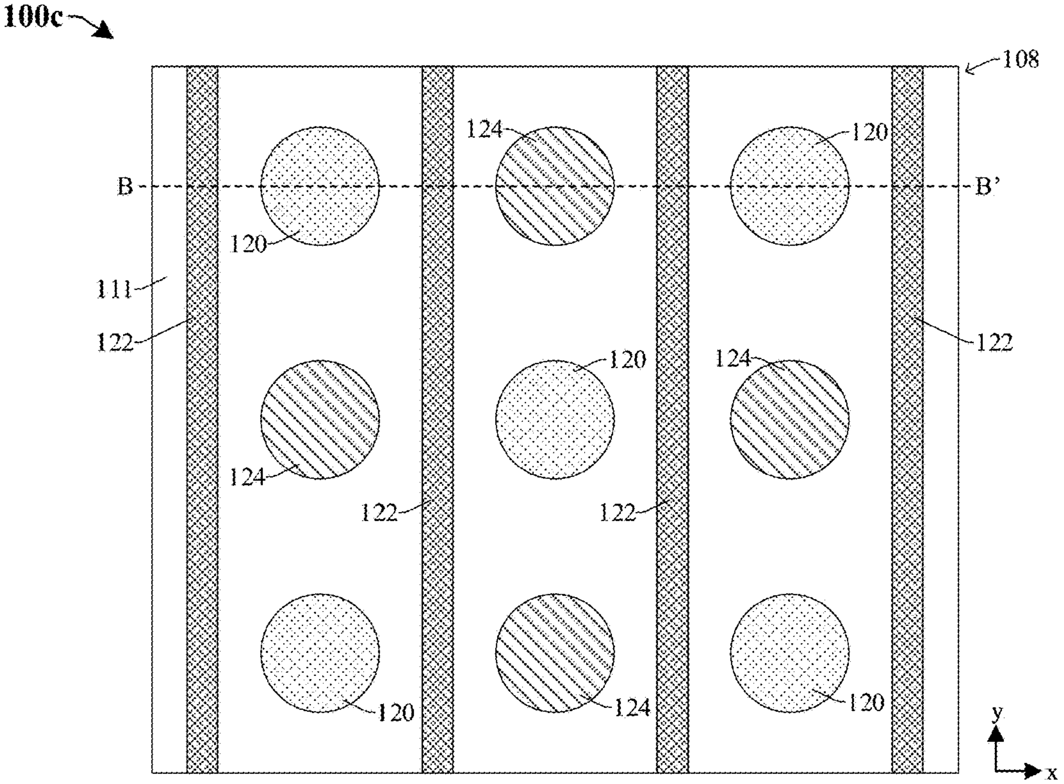

FIGS. 1A-1C illustrate various views **100*a-c* of some embodiments of a stacked IC device comprising bond structures with shield structures. FIG. 1A illustrates a cross-sectional view 100*a* of some embodiments of the stacked IC device. FIG. 1B illustrates a top view 100*b* of some embodiments of the stacked IC device taken along the line A-A' of FIG. 1A. FIG. 1C illustrates a top view 100*c* of some embodiments of the stacked IC device taken along the line B-B' of FIG. 1A**.

The stacked IC device comprises a first IC chip 102 having a first bond structure 106 and a second IC chip 104 having a second bond structure 108. The first and second bond structures 106, 108 meet at a first bond interface 105. The first IC chip 102 further includes a first substrate 101 and a plurality of pixels 132 that each comprise a plurality of photodetectors 130 disposed within the first substrate 101. The first bond structure 106 comprises a first plurality of conductive bond pads 112 and a first plurality of bond contacts 118 disposed within a first dielectric structure 110. The conductive bond pads 112 of the first bond structure 106 are electrically coupled to a plurality of wires 128 of the first IC chip 102 by way of the first plurality of bond contacts 118. In some embodiments, the first plurality of conductive bond pads 112 are electrically coupled to the pixels 132 (e.g., by way of a first interconnect structure (not shown) disposed on the first substrate 101).

The second IC chip 104 comprises a second substrate 103 and a plurality of semiconductor devices 134 disposed on the second substrate 103. The plurality of semiconductor devices 134 may, for example, be or comprise readout transistors (e.g., comprising source-follower transistor(s), select transistor(s), reset transistor(s), etc.), logic devices, other suitable semiconductor devices, or the like. The second bond structure 108 overlies the second substrate 103 and is electrically coupled to the semiconductor devices 134 (e.g., by way of a second interconnect structure (not shown) disposed on the second substrate 103).

The second bond structure 108 comprises a second plurality of conductive bond pads 120 and a second plurality of bond contacts 126 disposed within a second dielectric structure 111. The conductive bond pads 120 of the second bond structure 108 are electrically coupled to a plurality of wires 128 of the second IC chip 104 by way of the second plurality of bond contacts 126. The first plurality of conductive bond pads 112 and the second plurality of conductive bond pads 120 are bonded to each other at the first bond interface 105. As such, the first and second pluralities of conductive bond pads 112, 120 facilitate electrical coupling between the first and second IC chips 102, 104. Further, the first and second dielectric structures 110, 111 are bonded to one another at the first bond interface 105. Accordingly, the first bond interface 105 comprises dielectric-to-dielectric bond interface(s) and conductor-to-conductor bond interface(s).

In some embodiments, the first bond structure 106 further comprises a first plurality of dummy bond pads 116 disposed alternatingly with the first plurality of conductive bond pads 112 in an array comprising a plurality of rows and a plurality of columns. Dummy bond pads in the first plurality of dummy bond pads 116 are each disposed between adjacent conductive bond pads in the first plurality of conductive bond pads 112. This increases a distance between the adjacent conductive bond pads within the first plurality of conductive bond pads 112. Further, the second bond structure 108 further comprises a second plurality of dummy bond pads 124 disposed alternatingly with the second plurality of conductive bond pads 120 in an array comprising a plurality of rows and a plurality of columns. Dummy bond pads in the second plurality of dummy bond pads 124 are each disposed between adjacent conductive bond pads within the second plurality of conductive bond pads 120. As a result, a distance between the adjacent conductive bond pads in the second plurality of conductive bond pads 120 is increased. Further, the dummy bond pads 116, 124 are bonded to one another at the first bond interface 105.

The first bond structure 106 further comprises a first plurality of shield structures 114 disposed laterally between the first plurality of conductive bond pads 112 and the first plurality of dummy bond pads 116. For example, the shield structures 114 of the first bond structure 106 continuously extend along and are disposed between adjacent columns of the first plurality of conductive bond pads 112 and the first plurality of dummy bond pads 116. The second bond structure 108 further comprises a second plurality of shield structures 122 disposed laterally between the second plurality of conductive bond pads 120 and the second plurality of dummy bond pads 124. For example, the shield structures 122 of the second bond structure 108 are disposed between adjacent columns of the second plurality of conductive bond pads 120 and the second plurality of dummy bond pads 124. Further, the first plurality of shield structures 114 and the second plurality of shield structures 122 are bonded to one another at the first bond interface 105.

As illustrated in the cross-sectional view 100*a* and top view 100*b*, the plurality of pixels 132 are disposed in an array comprising a plurality of rows and a plurality of columns 140*a-c*. In some embodiments, the plurality of pixels 132 respectively comprise one or more photodetectors that may be disposed in a 2×4 shared pixel layout (e.g., comprising 8 photodetectors) or some other suitable number of photodetectors. The plurality of columns 140*a-c* includes a first column 140*a* of pixels, a second column 140*b* of pixels, and a third column 140*c* of pixels. During operation of the stacked IC device, electrical signals (e.g., voltages, currents, etc.) are transmitted from the first IC chip 102 to the second IC chip by way of the first plurality of conductive bond pads 112 and the second plurality of conductive bond pads 120 (e.g., from the photodetectors 130 to the semiconductor devices 134). For example, readout operations on the plurality of pixels 132 may be completed column-by-column such that electrical signals from pixels within the first column 140*a* may be read first, electrical signals from pixels within the second column 140*b* may be read second, and so on. The first plurality of conductive bond pads 112 are configured to transfer the electrical signals from each pixel within a corresponding column 140*a-c* during the readout operations. While a readout operation is performed on pixels in an individual column, pixels in adjacent columns may be set to a high voltage. For instance, during readout of the pixels in the first column 130*a* the pixels within the second and third columns 140*b-c* are set to the high voltage.

By virtue of adjacent conductive bond pads in the first and second pluralities of conductive bond pads 112, 120 being laterally separated from one another by one or more shield structures 114, 122 and/or one or more dummy bond pads 116, 124, parasitic capacitance and inductance between the adjacent conductive bond pads is reduced. For instance, as seen in FIG. 1B, the first plurality of conductive bond pads 112 comprises a first conductive bond pad 112*a* adjacent to a second conductive bond pad 112*b*, where the first and second conductive bond pads 112*a*, 112*b* are separated from one another by a first dummy bond pad 116*a* and at least two shield structures in the first plurality of shield structures 114. The first dummy bond pad 116*a* and the at least two shield structures in the first plurality of shield structures 114 increases a distance between the first and second conductive bond pads 112*a*, 112*b* and/or obstructs electromagnetic fields between the first and second conductive bond pads 112*a*, 112*b*. Further, in some embodiments, the first plurality of shield structures 114 and the second plurality of shield structures 122 may be electrically coupled to ground, electrically coupled to a voltage source, or electrically floating during readout of the pixels 132, thereby blocking and/or obstructing electromagnetic fields between conductive bond pads in adjacent columns. This, in part, reduces parasitic capacitance between the conductive bond pads. In another embodiment, the first plurality of shield structures 114 and the second plurality of shield structures 122 may comprise a dielectric material and are configured to reduce an effective dielectric constant between adjacent conductive bond pads, thereby reducing parasitic capacitance between adjacent conductive bond pads. Accordingly, issues due to a proximity between adjacent conductive bond pads in first and second pluralities of conductive bond pads 112, 120 are reduced (e.g., issues related to crosstalk are reduced), thereby decreasing signal interference in the first and second bond structures 106, 108. As a result, an overall performance of the stacked IC device is increased (e.g., the accuracy of an output from the stacked IC device is increased). For example, by virtue of the first and second bond structures 106, 108 comprising the shield structures 114, 122, a quality of an image produced by the pixels 132 is increased.

In some embodiments, the first plurality of shield structures 114 and the second plurality of shield structures 122 are electrically coupled to ground (e.g., electrically coupled to 0 volts). In further embodiments, the first plurality of shield structures 114 and the second plurality of shield structures 122 are electrically coupled to a voltage source (not shown) configured to apply a voltage to the shield structures 114, 122. In yet further embodiments, the first plurality of shield structures 114 and the second plurality of shield structures 122 are electrically floating. In various embodiments, the first plurality of dummy bond pads 116 and the second plurality of dummy bond pads 124 are electrically floating.

The first plurality of conductive bond pads 112 and the second plurality of conductive bond pads 120 may, for example, be or comprise copper, aluminum, tungsten, silver, gold, some other conductive material, or any combination of the foregoing. The first plurality of bond contacts 118 and the second plurality of bond contacts 126 may, for example, be or comprise copper, aluminum, tungsten, titanium nitride, tantalum nitride, some other conductive material, or any combination of the foregoing. The first plurality of dummy bond pads 116 and the second plurality of dummy bond pads 124 may, for example, be or comprise copper, aluminum, tungsten, silver, gold, some other conductive material, or any combination of the foregoing.

In some embodiments, the first plurality of shield structures 114 and the second plurality of shield structures 122 comprise a conductive material such as copper, aluminum, tungsten, silver, gold, some other conductive material, or any combination of the foregoing. In yet further embodiments, the first plurality of shield structures 114 and the second plurality of shield structures 122 comprise a dielectric material such as silicon dioxide, a low-k dielectric material, some other dielectric material, or any combination of the foregoing. As used herein, a low-k dielectric material is a dielectric with a dielectric constant less than about 3.9.

The first plurality of shield structures 114 and the second plurality of shield structures 122 comprising the dielectric material decreases an effective dielectric constant between adjacent conductive bond pads in the first and second bond structures 106, 108, thereby decreasing parasitic capacitance. In various embodiments, a dielectric constant of the first plurality of shield structures 114 and the second plurality of shield structures 122 is less than a dielectric constant of the first and second dielectric structures 110, 111.

In some embodiments, the first plurality of conductive bond pads 112, the second plurality of conductive bond pads 120, the first plurality of shield structures 114, and the second plurality of shield structures 122 comprise a same conductive material (e.g., copper, aluminum, tungsten, silver gold, etc.) In further embodiments, the first plurality of conductive bond pads 112 and the second plurality of conductive bond pads 120 comprise a first material (e.g., copper, aluminum, tungsten, silver gold, etc.) and the first plurality of shield structures 114 and the second plurality of shield structures 122 comprise a second material (silicon dioxide, a low-k dielectric material, etc.) different from the first material.

As illustrated in top views 100*b* and 100*c* of FIGS. 1B and 1C, the first bond structure 106 and the second bond structure 108 have a same layout. Thus, in some embodiments, a layout of the first bond structure 106 is symmetrical with a layout of the second bond structure 108. This, in part, increases bonding adhesion at the first bond interface (105 of FIG. 1A) between the first and second bond structures 106, 108. Further, conductive bond pads in the first plurality of conductive bond pads 112 are disposed alternatingly with the dummy bond pads in the first plurality of dummy bond pads 116 in an array comprising a plurality of rows and columns. Accordingly, the first plurality of conductive bond pads 112 has a zigzag layout along the rows and columns of the array that increases a shortest distance between adjacent conductive bond pads in the first bond structure 106. This reduces issues due to a proximity between adjacent conductive bond pads in the first bond structure 106 (e.g., issues related to crosstalk are reduced), thereby decreasing signal interference in the first bond structure 106. For example, by virtue of the zigzag layout, a first shortest distance 136 between the first conductive bond pad 112*a* and a third conductive bond pad 112*c* is greater than a second shortest distance 138 between the first conductive bond pad 112*a* and the first dummy bond pad 116*a*. In various embodiments, the first shortest distance 136 is about 1.414 times the second shortest distance 138.

FIGS. 2A-2D illustrate various top views 200*a*-200*d* of some other embodiments of the stacked IC device of FIGS. 1A-1C, where a plurality of pixels comprising photodetectors 130 (represented by dashed lines and/or dashed boxes) overlies the first bond structure 106. Further, it will be appreciated that while the top views 200*a*-200*d* of FIGS. 2A-2D are illustrated and/or described in regards to the first bond structure 106, the second bond structure (108 of FIG. 1A) has a same top view and/or same layout as the first bond structure 106 of FIGS. 2A-2D. Thus, in some embodiments, a layout of the first bond structure 106 is symmetrical with a layout of the second bond structure (108 of FIG. 1A).

Figure 2A:
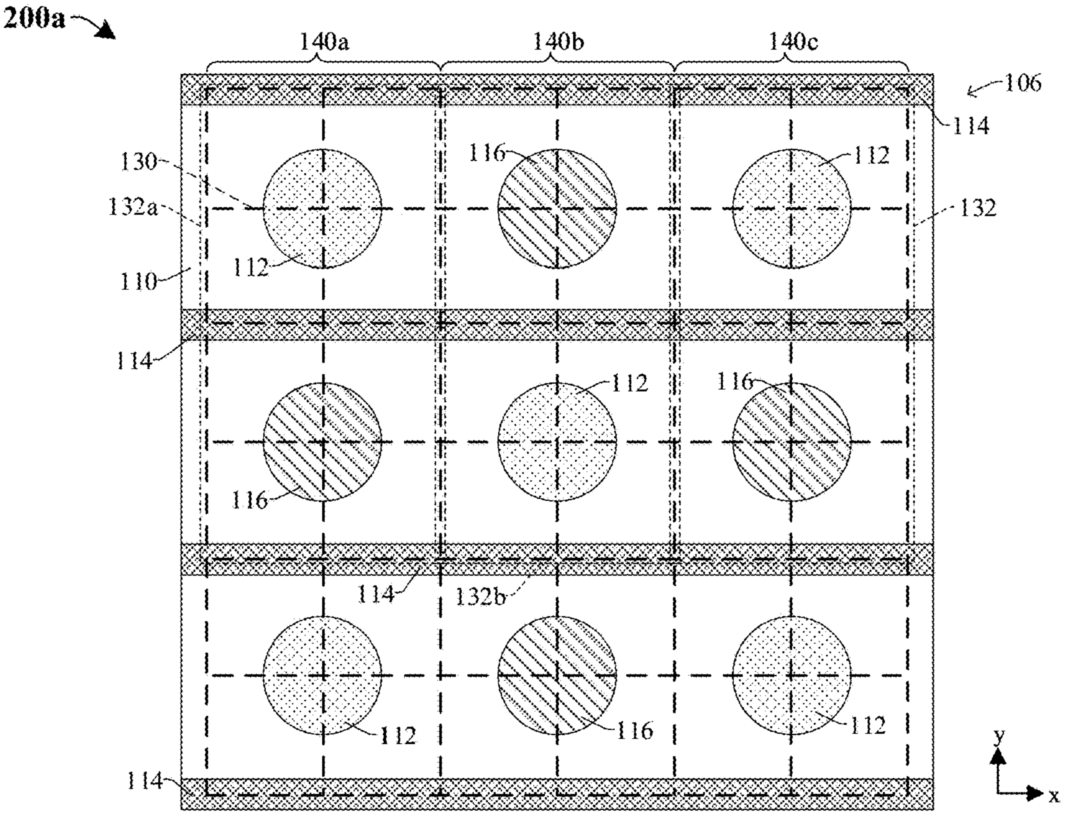
FIGS. 2A-2D illustrate various top views of some other embodiments of the stacked IC device of FIGS. 1A-1C.

As illustrated in the top view 200*a* of FIG. 2A, the plurality of pixels 132 includes a first pixel 132*a* and a second pixel 132*b* arranged in adjacent columns. For example, the first pixel 132*a* is disposed in a first column 140*a* of the plurality of pixels and the second pixel 132*b* is disposed in a second column 140*b*. It will be appreciated that for ease of illustrated only a portion of the plurality of pixels 132 are labeled in FIGS. 2A-2D. In some embodiments, the pixels 132 each comprise a 2×4 shared pixel layout comprising a first 2×2 subarray of photodetectors adjacent to a second 2×2 subarray of photodetectors. In such embodiments, a floating diffusion node (not shown) may be disposed at a crossroad of each 2×2 subarray of photodetectors in the plurality of pixels. Accordingly, a corresponding individual bond structure in the first plurality of conductive bond pads 112 directly underlies each of the pixels 132. Further, the two floating diffusion nodes (not shown) of each of the pixels 132 may be directly electrically coupled to the corresponding individual conductive bond pad in the first plurality of conductive bond pads 112.

In some embodiments, readout operations on the plurality of pixels may be completed column by column such that the first column 140*a* (comprising the first pixel 132*a*) may be read first, the second column 140*b* (comprising the second pixel 132*b*) may be read second, and so on. As a result, pixels in each column may be read concurrently with one another. Accordingly, conductive bond pads 112 in the columns of the first plurality of conductive bond pads 112 are each transferring an electrical signal (e.g., voltage(s), current(s), etc.) from the first IC chip (102 of FIG. 1A) to the second IC chip (104 of FIG. 1A). The zigzag layout increases a distance between adjacent conductive bond pads in the first plurality of conductive bond pads 112, thereby decreasing crosstalk (e.g., due to parasitic capacitance, parasitic inductance, etc.) between the conductive bond pads 112. Further, the first plurality of shielding structures 114 and/or the first plurality of dummy bond pads 116 are disposed between adjacent conductive bond pads in the first plurality of conductive bond pads 112 and disrupt and/or obstruct electromagnetic fields between the adjacent conductive pads. This further decreases crosstalk (e.g., by further decreasing parasitic capacitance, mutual interference, etc.) between the adjacent conductive bond pads, thereby increasing the quality of an image produced from the plurality of pixels 132.

Figure 2B:
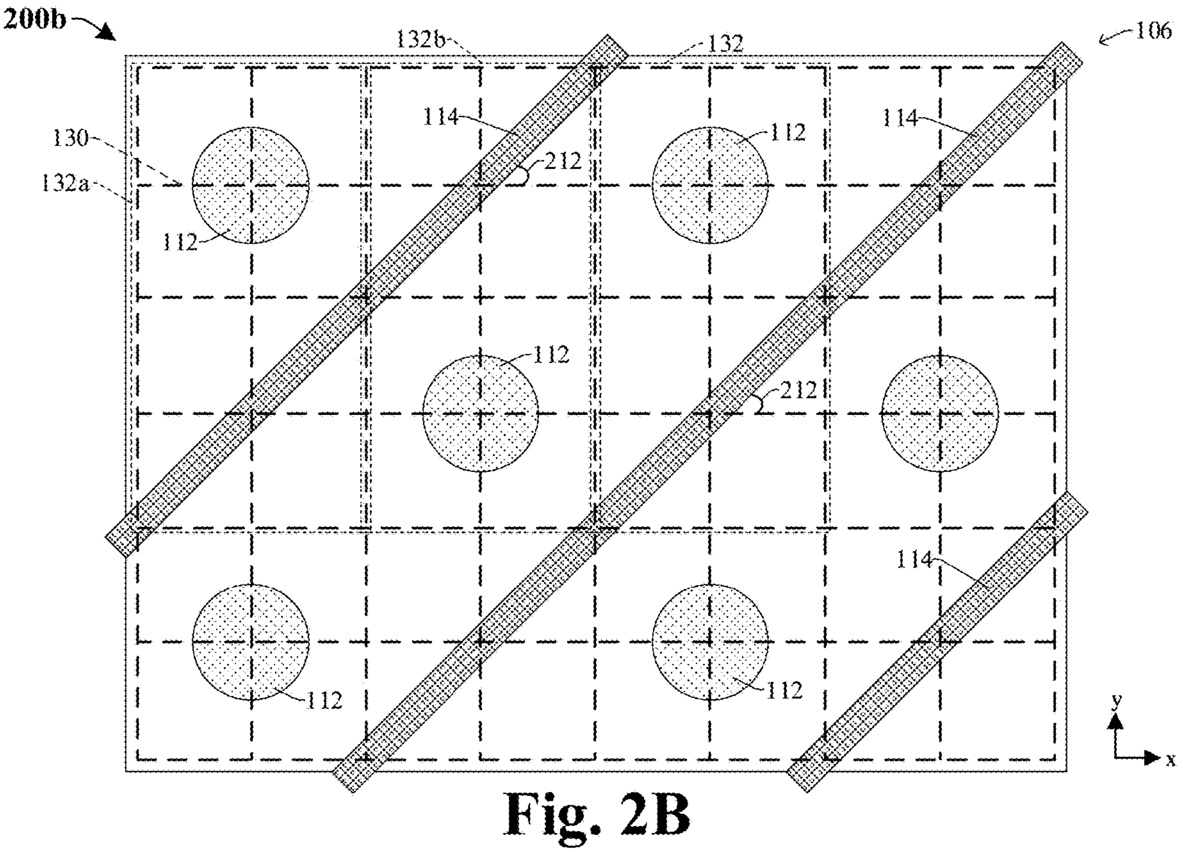

As illustrated in the top view 200*b* of FIG. 2B, in some embodiments the first plurality of dummy bond pads (116 of FIG. 2A) is omitted. In various embodiments, because the second bond structure (108 of FIG. 1A) has the same layout as the first bond structure 106, the second plurality of dummy bond pads (124 of FIGS. 1A and 1C) is omitted as well. Further, shield structures in the first plurality of shield structures 114 are each elongated at a first angle 212 relative to rows of the plurality of photodetectors 130. In some embodiments, the first angle 212 is 45 degrees, within a range of about 40 degrees to about 50 degrees, or some other suitable value.

Figure 2C:
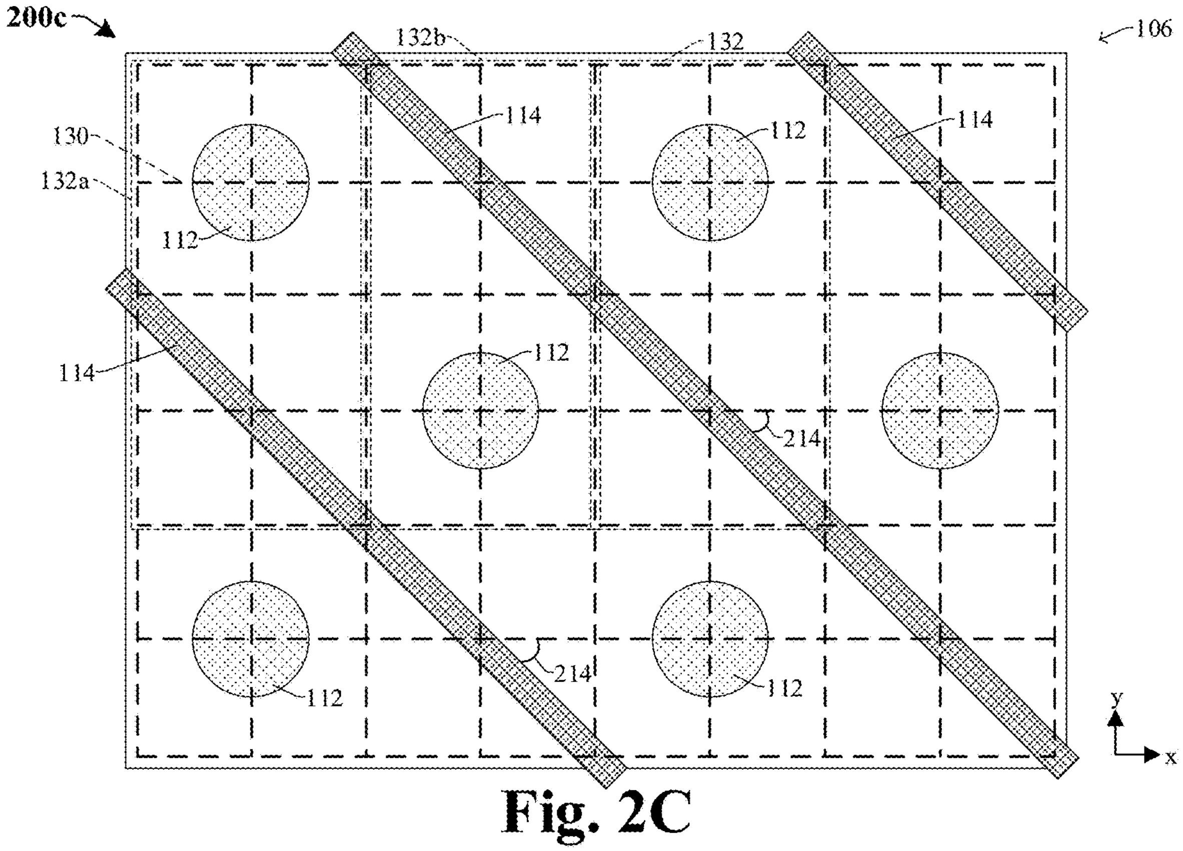

FIG. 2C illustrates the top view 200*c* corresponding to some other embodiments of the top view 200*b* of FIG. 2B, where the shield structures in the first plurality of shield structures 114 are each elongated at a second angle 214 relative to rows of the plurality of photodetectors 130. In some embodiments, the second angle 214 is −45 degrees, within a range of about −40 degrees to about −50 degrees, or some other suitable value.

Figure 2D:
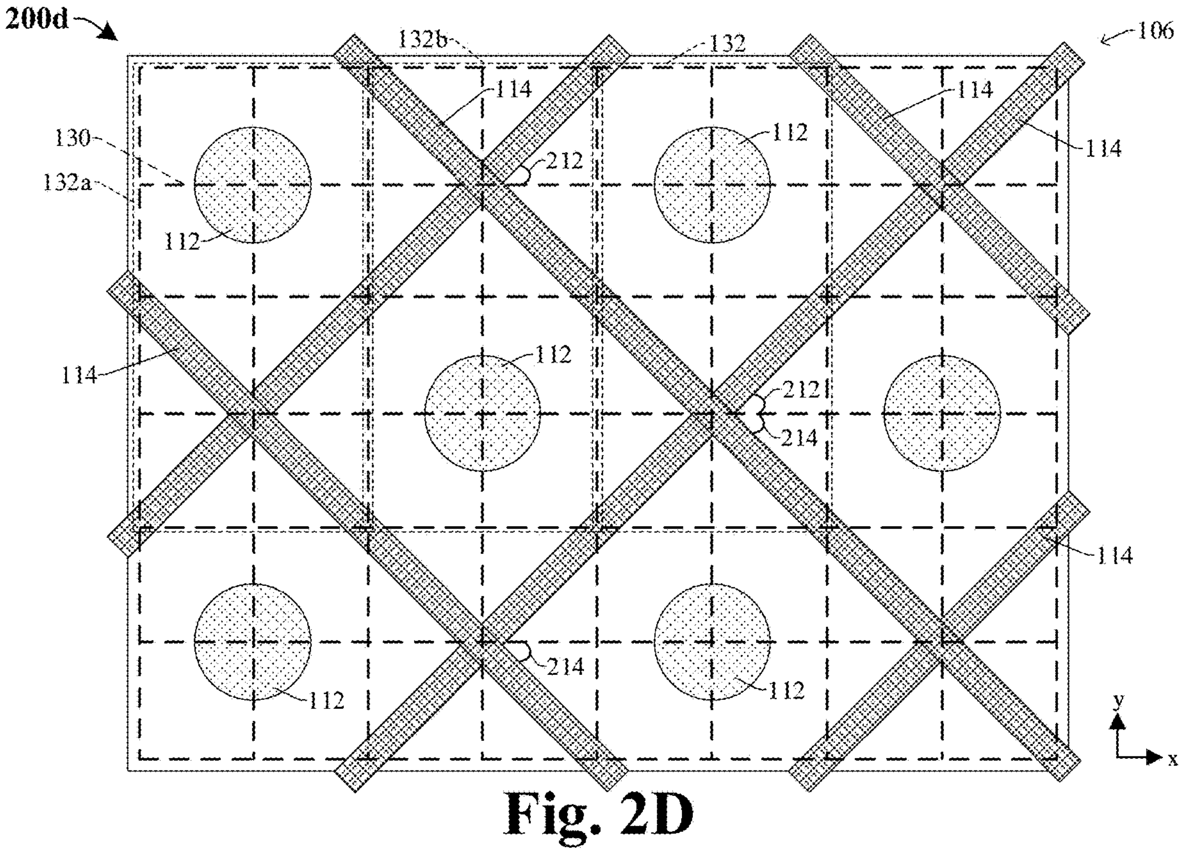

FIG. 2D illustrates the top view 200*d* corresponding to some other embodiments of the top view 200*b* of FIG. 2B, where the first plurality of shield structures 114 comprises a first subset of shield structures each elongated at a first angle 212 relative to rows of the plurality of photodetectors 130 and a second subset of shield structures each elongated at a second angle 214 relative to the rows. In various embodiments, the first angle 212 is different from the second angle 214. The first angle 212 may, for example, be 45 degrees, within a range of about 40 to about 50 degrees, or some other suitable value. The second angle 214 may, for example, be −45 degrees, within a range of about −40 to about −50 degrees, or some other suitable value. In some embodiments, the first plurality of shield structures 114 are arrange in a grid pattern that comprise at least one individual shield structure disposed between each pair of adjacent conductive bond pads in the first plurality of conductive bond pads 112. This further decreases crosstalk between the first plurality of conductive bond pads 112.

By virtue of the shield structures of the first plurality of shield structures 114 being elongated at an angle (as illustrated and/or described in FIGS. 2B-2D) relative to rows of the plurality of photodetectors 130, the formation of bubbles and/or voids at the first bond interface (105 of FIG. 1A) during a bonding process (e.g., as illustrated and/or described in FIG. 19) may be mitigated. This occurs because the shield structures may help the discharge of gas between the first and second IC chips (102, 104 of FIG. 1A) during the bonding process. As a result, bonding adhesion between the first and second IC chips (102, 104 of FIG. 1A) is increased and electrical coupling between the first and second bond structures (106, 108 of FIG. 1A) is increased.

Figure 3:
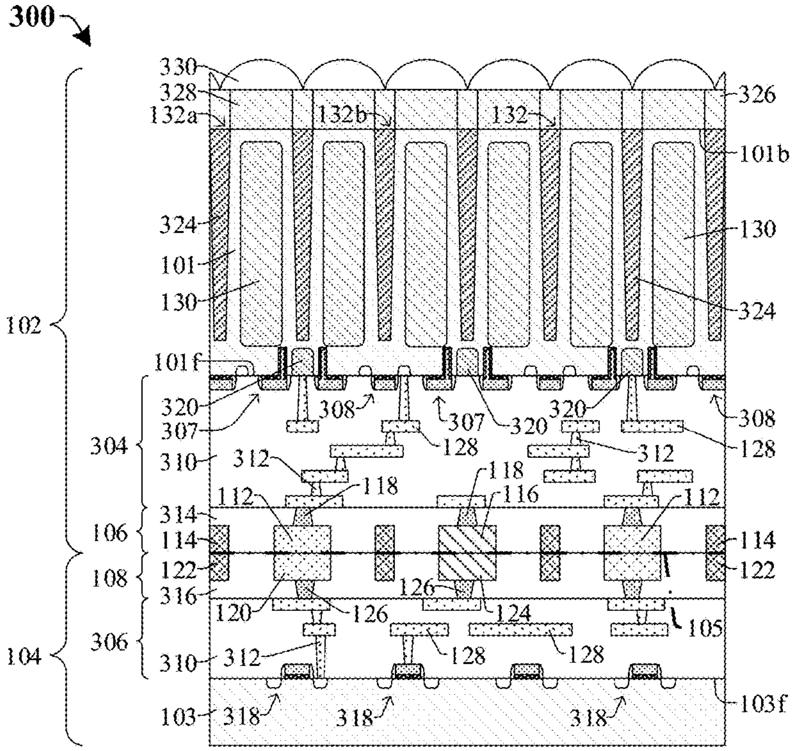
FIG. 3 illustrates a cross-sectional view of some embodiments of a stacked IC device comprises a plurality of pixels disposed on a first IC chip electrically coupled to a second IC chip by way of bond structures comprising shield structures.

FIG. 3 illustrates a cross-sectional view 300 of some embodiments of a stacked IC device comprising a plurality of pixels disposed on a first IC chip electrically coupled to a second IC chip by way of bond structures comprising shield structures. In some instances, the plurality of pixels 132 of FIG. 3 may correspond to the pixels 132 illustrated and/or described in FIGS. 2A-2D.

The stacked IC device comprises a first IC chip 102 bonded to a second IC chip 104. In some embodiments, the first IC chip 102 is configured as an imaging chip comprising a plurality of pixels 132 and the second IC chip 104 is configured as a logic chip comprising an application-specific integrated circuit (ASIC). The first IC chip 102 comprises a first substrate 101, a first interconnect structure 304 disposed on a front side 101*f* of the first substrate 101, and a first bond structure 106 disposed on the first interconnect structure 304. The first substrate 101 may, for example, be or comprise silicon, monocrystalline silicon, CMOS bulk, silicon-germanium, silicon-on-insulator (SOI) substrate, or some other semiconductor substrate and has a first doping type (e.g., p-type). A plurality of photodetectors 130 is disposed within the first substrate 101. The photodetectors 130 may have a second doping type (e.g., n-type) opposite the first doping type (e.g., p-type). In some embodiments, the first doping type is p-type and the second doping type is n-type, or vice versa. In addition, a plurality of floating diffusion nodes 320 is disposed in the first substrate 101. The floating diffusion nodes 320 may each be disposed at a crossroad of adjacent photodetectors 130. For example, a floating diffusion node 320 may be disposed at a crossroad of each 2×2 subarray of photodetectors in the plurality of photodetectors 130. Further, the floating diffusion nodes 320 may comprise the second doping type (e.g., n-type).

An isolation structure 324 extends into a back side 101*b* of the first substrate 101. The isolation structure 324 may be configured as a back side deep trench isolation (DTI) structure and may be or comprise a dielectric material (e.g., silicon dioxide, silicon nitride, a metal oxide, etc.), a metal material (e.g., tungsten, aluminum, titanium nitride, etc.), some other suitable material, or any combination of the foregoing. A grid structure 326 overlies the back side 101*b* of the first substrate 101 and comprises sidewalls defining a plurality of grid openings over each photodetector 130. A plurality of light filters 328 overlies the back side 101*b* of the first substrate 101 and is disposed in the plurality of grid openings. Further, a plurality of micro-lenses 330 overlie the light filters 328 and is configured to focus incident light towards the underlying photodetectors 130.

Further, a first plurality of transistors 307 is disposed on the front side 101*f* of the first substrate 101. The first plurality of transistors 307 are configured as transfer transistors that are configured to transfer accumulated charge from the photodetectors 130 to a corresponding floating diffusion node 320. For example, the first plurality of transistors 307 may be biased to form selectively conductive channel(s) within the first substrate 101 between the photodetectors 130 and a corresponding floating diffusion node 320. Thus, the first plurality of transistors 307 may selectively electrically couple the photodetectors 130 to a corresponding floating diffusion node 320. The first plurality of transistors 307 comprise individual gate dielectric structures stacked with individual gate electrodes (not labeled), where the gate dielectric structure is disposed between the first substrate 101 and the gate electrode. In some embodiments, the first plurality of transistors 307 may be configured as vertical transistors.

A second plurality of transistors 308 is disposed on the front side 101*f* of the first substrate 101. The second plurality of transistors 308 is configured to conduct readout of the accumulated charge of the photodetectors 130 to the second IC chip 104. In some embodiments, the second plurality of transistors 308 comprises a plurality of source-follower transistors, a plurality of reset transistors, and a plurality of select transistors. The second plurality of transistors 308 respectively comprise an individual gate dielectric structure stacked with an individual gate electrode (not labeled) and a pair of source/drain regions (not labeled) disposed on opposing sides of the individual gate electrode. Source/drain region(s) may refer to a source or a drain, individually or collectively dependent upon the context.

The second IC chip 104 underlies the first IC chip 102. The second IC chip 104 comprises a second substrate 103, a second interconnect structure 306 disposed on a front side 103*f* of the second substrate 103, and a second bond structure 108 disposed on the second interconnect structure 306. The second substrate 103 may, for example, be or comprise silicon, monocrystalline silicon, CMOS bulk, silicon-germanium, an SOI substrate, or some other semiconductor substrate. A third plurality of transistors 318 is disposed on the front side 103*f* of the second substrate 103. The third plurality of transistors 318 each comprise an individual gate dielectric structure stacked with an individual gate electrode (not labeled) and a pair of source/drain regions (not labeled) disposed on opposing sides of the individual gate electrode. In some embodiments, the third plurality of transistors 318 are metal-oxide-semiconductor field-effector transistors (MOSFETs), fin field-effect transistors (FinFETs), gate-all-around field-effect transistors (GAA FETs), nanosheet field-effect transistors, the like, or any combination of the foregoing. In some embodiments, the third plurality of transistors 318 is part of the ASIC configured to perform image signal processing (ISP) on corresponding electrical signals from the pixels 132 (e.g., from the floating diffusion nodes 320 or the second plurality of transistors 308).

In some embodiments, the first and second interconnect structures 304, 306 respectively comprise a plurality of conductive wires 128 and a plurality of conductive vias 312 disposed within an interconnect dielectric structure 310. The interconnect dielectric structure 310 may comprise a plurality of dielectric layers that may, for example, be or comprise silicon dioxide, a low-k dielectric material, an extreme low-k dielectric material, some other dielectric material, or any combination of the foregoing. The conductive vias and wires 312, 128 may, for example, be or comprise copper, aluminum, titanium nitride, tantalum nitride, tungsten, ruthenium, some other conductive material, or any combination of the foregoing.

In some embodiments, the first bond structure 106 comprises a first plurality of conductive bond pads 112, a first plurality of dummy bond pads 116, a first plurality of bond contacts 118, and a first plurality of shield structures 114 disposed within a first bond dielectric structure 314. In further embodiments, the second bond structure 108 comprises a second plurality of conductive bond pads 120, a second plurality of dummy bond pads 124, a second plurality of bond contacts 126, and a second plurality of shield structures 122 disposed within a second bond dielectric structure 316. The first bond structure 106 is bonded to the second bond structure 108 at a first bond interface 105. The first bond structure 106 and second bond structure 108 may be configured as illustrated and/or described in FIG. 1A-1C or 2A-2D. The first IC chip 102 is electrically coupled to the second IC chip 104 by way of the first and second bond structures 106, 108. For example, the second plurality of transistors 308 may be directly electrically coupled to one or more transistors in the third plurality of transistors 318 by way of the interconnect structures 304, 306 and the bond structures 106, 108. By virtue of a zigzag layout of the conductive bond pads 112, 120 (e.g., as illustrated and/or described in FIGS. 1B and 1C) and a layout of the dummy bond pads 116, 124 and/or the shield structures 114, 122, signal interference (e.g., due to crosstalk) between adjacent conductive bond pads in the first and second bond structures 106, 108 is reduced. As a result, the quality of an image produced from the pixels 132 is increased.

Figure 4A:
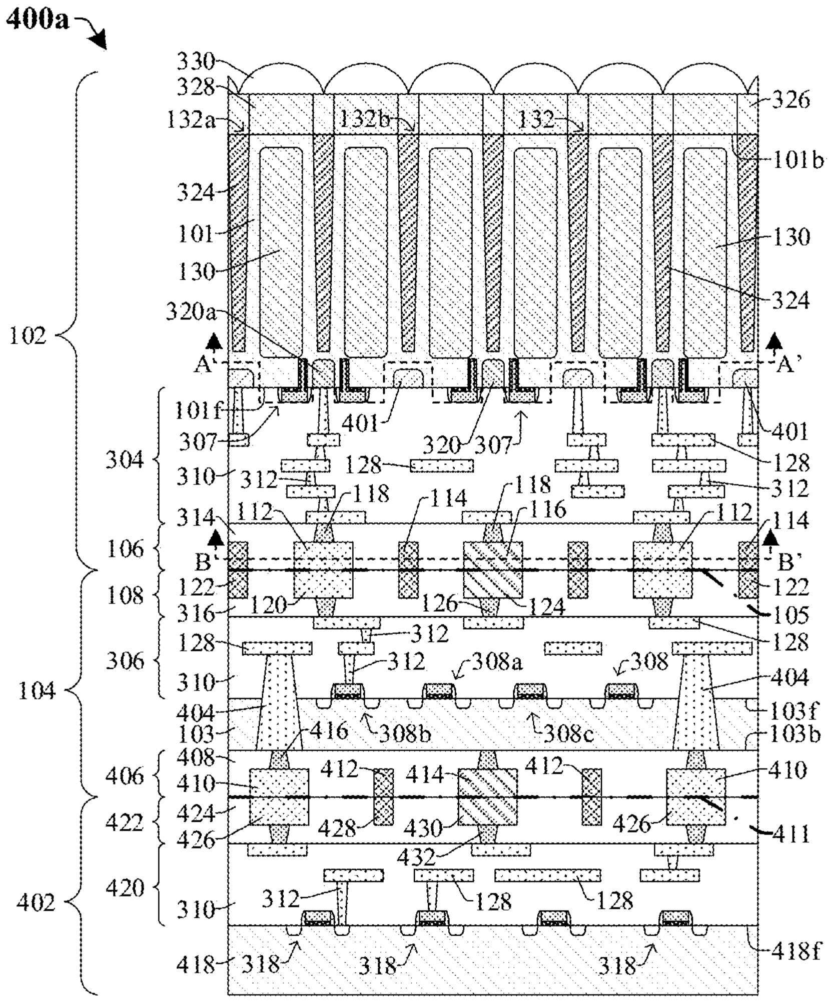
FIG. 4A illustrates a cross-sectional view of some embodiments of a stacked IC device comprises a plurality of pixels disposed across a first IC chip and a second IC chip, where the first IC chip is electrically coupled to the second IC chip by way of bond structures comprising shield structures.

FIG. 4A illustrates a cross-sectional view 400*a* of some embodiments of a stacked IC device corresponding to some other embodiments of the stacked IC device of FIG. 3, where the stacked IC device further comprises a third IC chip 402 underlying the second IC chip 104. In some embodiments, the first IC chip 102 is configured as an imaging chip comprising the plurality of photodetectors 130 and the first plurality of transistors 307, the second IC chip 104 is configured as a pixel device chip comprising the second plurality of transistors 308, and the third chip 402 is configured as a logic chip comprising an ASIC.

In some embodiments, the first IC chip 102 further comprises a plurality of well regions 401 disposed within the first substrate 101 between adjacent floating diffusion nodes 320. The well regions 401 comprise the first doping type (e.g., p-type) and are configured to increase electrical isolation between adjacent pixels in the plurality of pixels 132. Further, each of the pixels 132 span the first and second IC chips 102, 104. For example, individual transistors of the first plurality of transistors 307 that are part of the first pixel 132*a* are disposed on the first IC chip 102 and individual transistors of the second plurality of transistors 308 that are part of the first pixel 132*a* are disposed on the second IC chip 104.

The second plurality of transistors 308 is disposed on the front side 103*f* of the second substrate 103. The second plurality of transistors 308 may occupy a relatively large lateral footprint over the second substrate 103. By disposing the second plurality of transistors 308 on the second substrate 103 instead of, for example, on the first substrate 101 of the first IC chip 102, a number of photodetectors 130 disposed on the first substrate 101 may be increased without decreasing a size of the photodetectors 130. Accordingly, device density may be increased without reducing a performance of the photodetectors 130.

In various embodiments, the second plurality of transistors 308 comprises a reset transistor 308*a*, a source-follower transistor 308*b*, and a select transistor 308*c* individual to the first pixel 132*a*. A first floating diffusion node 320*a* of the first pixel 132*a* is directly electrically coupled to a gate electrode of the source-follower transistors 308*b* by virtue of the first and second interconnect structures 304, 306 and the first and second bond structures 106, 108.

In some embodiments, the second IC chip 104 further comprises a third bond structure 406 disposed on a back side 103*b* of the second substrate 103 and a plurality of through substrate vias (TSVs) 404 extending through the second substrate 103. The TSVs 404 are configured to electrically couple the third bond structure 406 to the second interconnect structure 306. In some embodiments, the third bond structure 406 comprises a third plurality of conductive bond pads 410, a third plurality of dummy bond pads 414, a third plurality of bond contacts 416, and a third plurality of shield structures 412 disposed within a third bond dielectric structure 408. The third plurality of conductive bond pads 410 may be electrically coupled to conductive wires 128 of the second interconnect structure 306 by way of the TSVs 404 and the third plurality of conductive bond contacts 416.

In various embodiments, the third IC chip 402 comprises a third substrate 418, a third interconnect structure 420 disposed on a front side 418*f* of the third substrate 418, and a fourth bond structure 422 disposed on the third interconnect structure 420. The third plurality of transistors 318 is disposed on the front side 418*f* of the third substrate 418. The fourth bond structure 422 is configured to electrically couple the second IC chip 104 to the third plurality of transistors 318 by way of the third interconnect structure 420. In some embodiments, the third interconnect structure 420 comprises a plurality of conductive wires 128 and a plurality of conductive vias 312 disposed within an interconnect dielectric structure 310. In some embodiments, the fourth bond structure 422 comprises a fourth plurality of conductive bond pads 426, a fourth plurality of dummy bond pads 430, a fourth plurality of bond contacts 432, and a fourth plurality of shield structures 428 disposed within a fourth bond dielectric structure 424. The third bond structure 406 meets the fourth bond structure 422 at a second bond interface 411 that comprises dielectric-to-dielectric bonds and conductor-to-conductor bonds.

In further embodiments, the third and fourth bond structures 406, 422 may be configured as the first and second bond structures 106, 108 (e.g., as illustrated and/or described in FIGS. 1A-1C and 2A-2D). In yet further embodiments, layouts of the third and fourth bond structures 406, 422 may be the same as one another and may be different from the first and second bond structures 106, 108. For example, in an embodiment, the dummy bond pads 414, 430 may be omitted from the third and fourth bond structures 406, 422 (not shown). In a further embodiment, both the dummy bond pads 414, 430 and the shield structures 412, 428 may be omitted from the third and fourth bond structures 406, 422 (not shown).

Figure 4B:
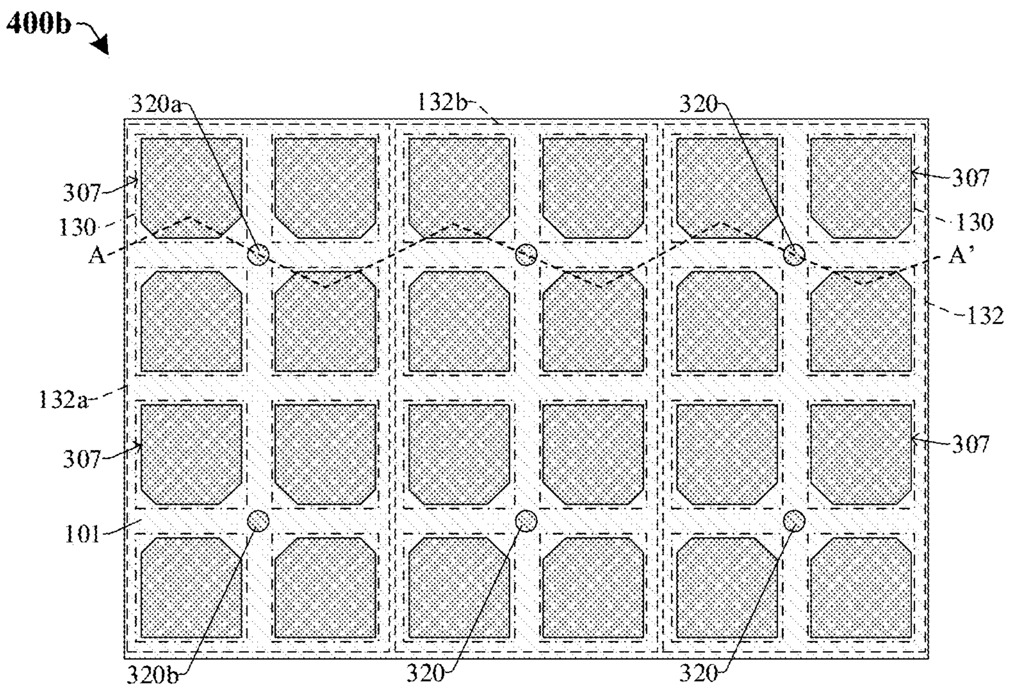
FIG. 4B illustrates a top view of some embodiments of the stacked IC device of FIG. 4A taken along the line A-A' of FIG. 4A.

FIG. 4B illustrates a top view 400*b* of some embodiments of the stacked IC device of FIG. 4A taken along the line A-A' of FIG. 4A. The top view 400*b* of FIG. 4B illustrates some embodiments of a shared pixel layout of the pixels 132.

In some embodiments, the pixels 132 each comprise a 2×4 shared pixel layout comprising a first 2×2 subarray of photodetectors adjacent to a second 2×2 subarray of photodetectors. The floating diffusion nodes 320 are each disposed at a crossroad of each 2×2 subarray of photodetectors. In some embodiments, the pixels 132 comprises at least two floating diffusion nodes 320, where the corresponding floating diffusion nodes 320 of each pixel 132 are directly electrically coupled to one another (e.g., through conductive wires and vias 128, 312 of the first interconnect structure 304 of FIG. 4A). For example, the first pixel 132*a* comprises the first floating diffusion node 320*a* disposed at a crossroad of a first 2×2 subarray of photodetectors of the first pixel 132*a* and a second floating diffusion node 320*b* disposed at a crossroad of a second 2×2 subarray of photodetectors of the first pixel 132*a*. The first and second floating diffusion nodes 320*a*, 320*b* of the first pixel 132*a* are directly electrically coupled to one another by way of conductive features (e.g., wires and vias 128, 312 of FIG. 4A). Further, transistors in the first plurality of transistors 307 are each adjacent to a corresponding photodetector 130.

Figure 4C:
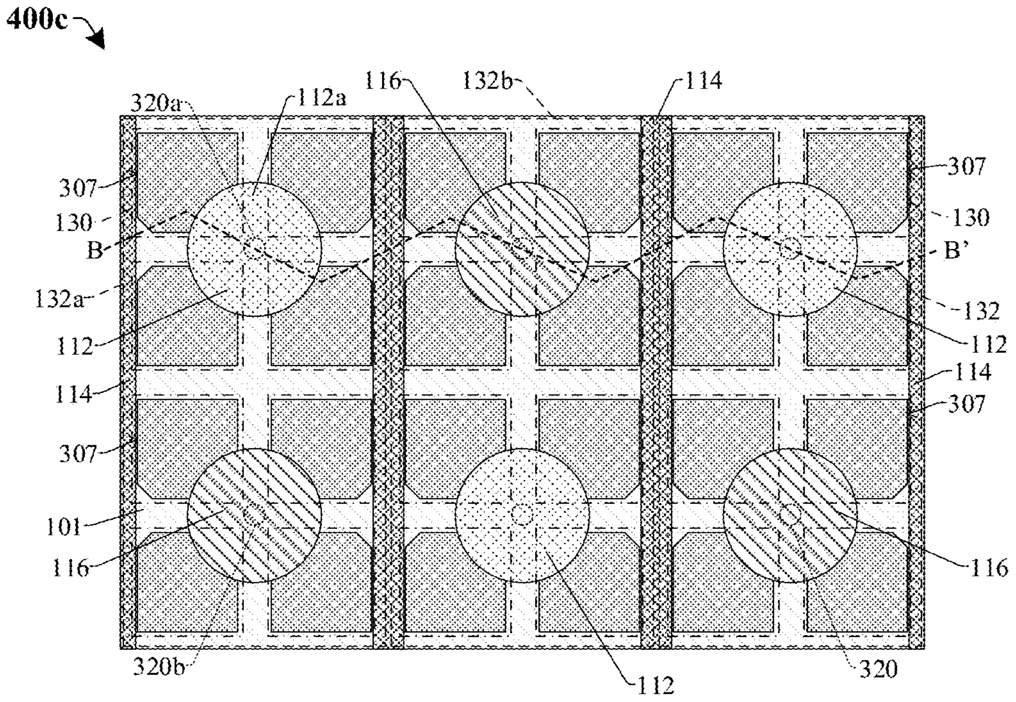
FIG. 4C illustrates a top view of some embodiments of the stacked IC device of FIG. 4A taken along the line B-B' of FIG. 4A.

FIG. 4C illustrates a top view 400*c* of some embodiments of the stacked IC device of FIG. 4A taken along the line B-B' of FIG. 4A. It will be appreciated that various structures (e.g., the first interconnect structure 304 and the first bond dielectric structure 314 of FIG. 4A) from the cross-sectional view 400*a* of FIG. 4A are omitted from the top view 400*c* of FIG. 4C for case of illustration.

The first plurality of conductive bond pads 112 and the first plurality of dummy bond pads 116 directly underlie the pixels 132. In some embodiments, a single conductive bond pad in the first plurality of conductive bond pads 112 is laterally aligned with each pixel 132 and is directly electrically coupled to the floating diffusion nodes 320 of each pixel 132. For example, a first conductive bond pad 112*a* of the first plurality of conductive bond pads 112 directly underlies the first pixel 132*a* and is directly electrically coupled to the first and second floating diffusion nodes 320*a*, 320*b* of the first pixel 132*a*. Further, in some embodiments, the first conductive bond pad 112*a* directly underlies the first floating diffusion node 320*a*. As a result, complex electrical routing in the first interconnect structure (304 of FIG. 4A) may be reduced, thereby decreasing a number of conductive features in the first IC chip (102 of FIG. 4A) and decreasing fabrication costs and design complexity of the first IC chip (102 of FIG. 4A). In addition, a single dummy bond pad in the first plurality of dummy bond pads 116 is laterally aligned with each pixel 132.

Figure 5A:
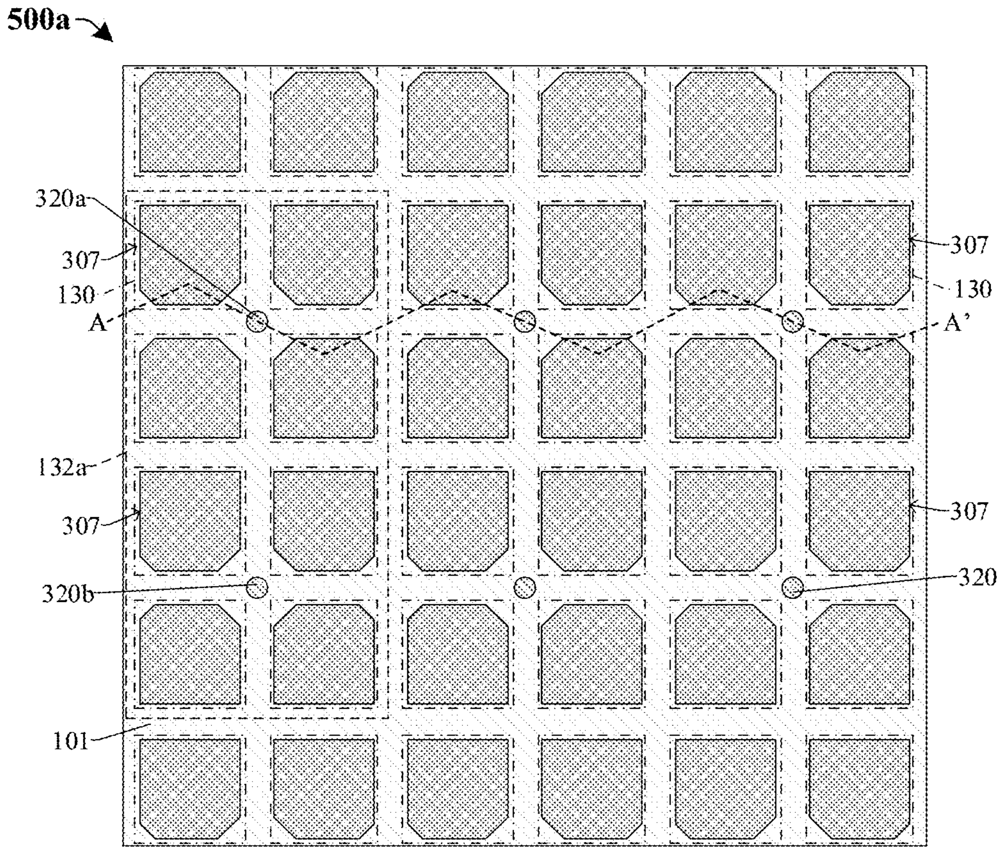
FIG. 5A illustrates a top view of some other embodiments of the stacked IC device of FIG. 4A taken along the line A-A' of FIG. 4A.
Figure 5B:
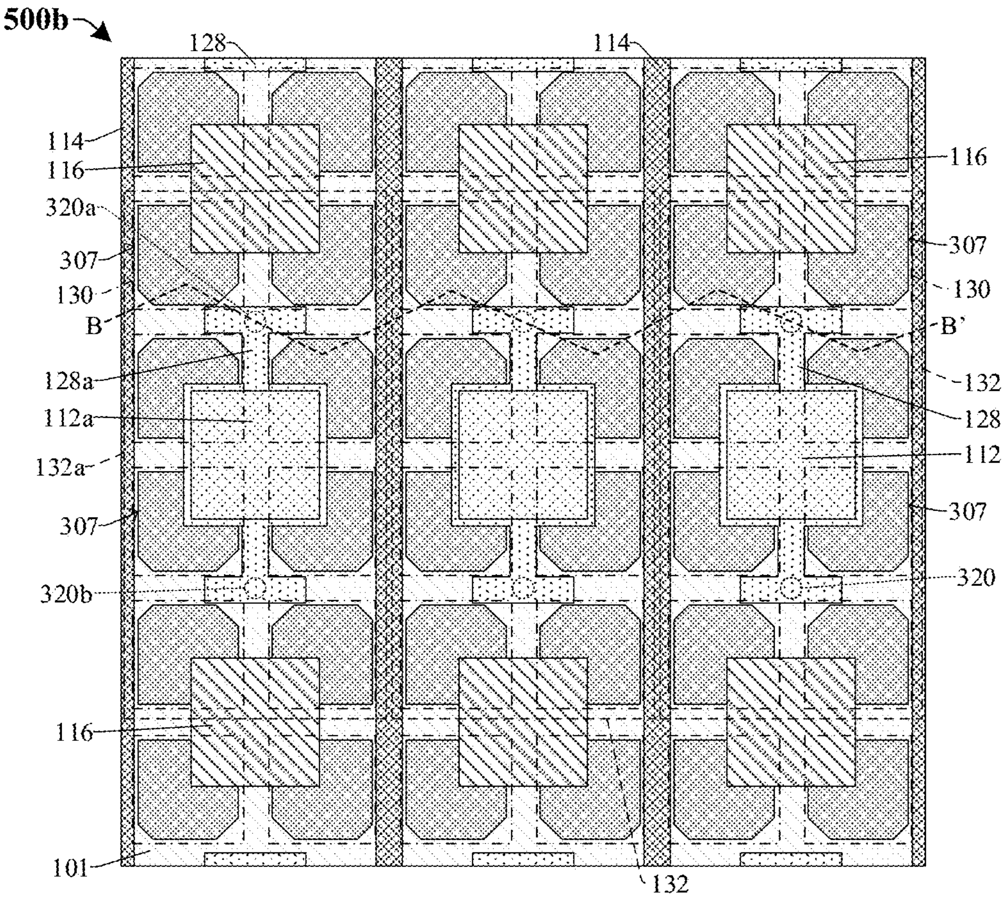
FIGS. 5B and 6A-6C illustrate various top views of some other embodiments of the stacked IC device of FIG. 4A taken along the line B-B' of FIG. 4A.

FIGS. 5A and 5B illustrate top views 500*a* and 500*b* of some other embodiments of the top views 400*b* and 400*c* of FIGS. 4B and 4C. FIG. 5A illustrates the top view 500*a* of some embodiments of the stacked IC device of FIG. 4A taken along the line A-A'. FIG. 5B illustrates the top view 500*b* of some embodiments of the stack IC device of FIG. 4A taken along the line B-B'. It will be appreciated that various structures (e.g., portions of the first interconnect structure 304 and the first bond dielectric structure 314 of FIG. 4A) from the cross-sectional view 400*a* of FIG. 4A are omitted from the top view 500*b* of FIG. 5B for case of illustration.

The top view 500*b* of FIG. 5B illustrates a topmost layer of conductive wires in the plurality of conductive wires 128 of the first interconnect structure (304 of FIG. 4A) that are disposed between the first substrate 101 and the first plurality of conductive bond pads 112. The topmost layer of conductive wires in the plurality of conductive wires 128 of the first interconnect structure (304 of FIG. 4A) is a layer of conductive wires in the first interconnect structure (304 of FIG. 4A) with the greatest distance from the front side of the first substrate 101 relative to other conductive wire layers in the first interconnect structure (304 of FIG. 4A). In some embodiments, a single conductive bond pad in the first plurality of conductive bond pads 112 is laterally aligned with a center of each pixel 132. For example, the first conductive bond pad 112*a* is aligned with a center of the first pixel 132*a* and is spaced laterally between the first floating diffusion node 320*a* and the second floating diffusion node 320*b*.

Further, the topmost layer of conductive wires in the plurality of conductive wires 128 comprises a single conductive wire laterally aligned with the center of each pixel 132 and configured to electrically couple the first plurality of conductive bond pads 112 to corresponding floating diffusion nodes 320 of each pixel 132. For example, the topmost layer of conductive wires comprises a first conductive wire 128*a* that continuously laterally extends from the first floating diffusion node 320*a* to the second floating diffusion node 320*b*. The first conductive wire 128*a* directly electrically couples the first and second floating diffusion nodes 320*a*, 320*b* to the first conductive bond pad 112*a*. In further embodiments, the first plurality of conductive bond pads 112 and the first plurality of dummy bond pads 116 each have a rectangular shape.

Figure 6A:
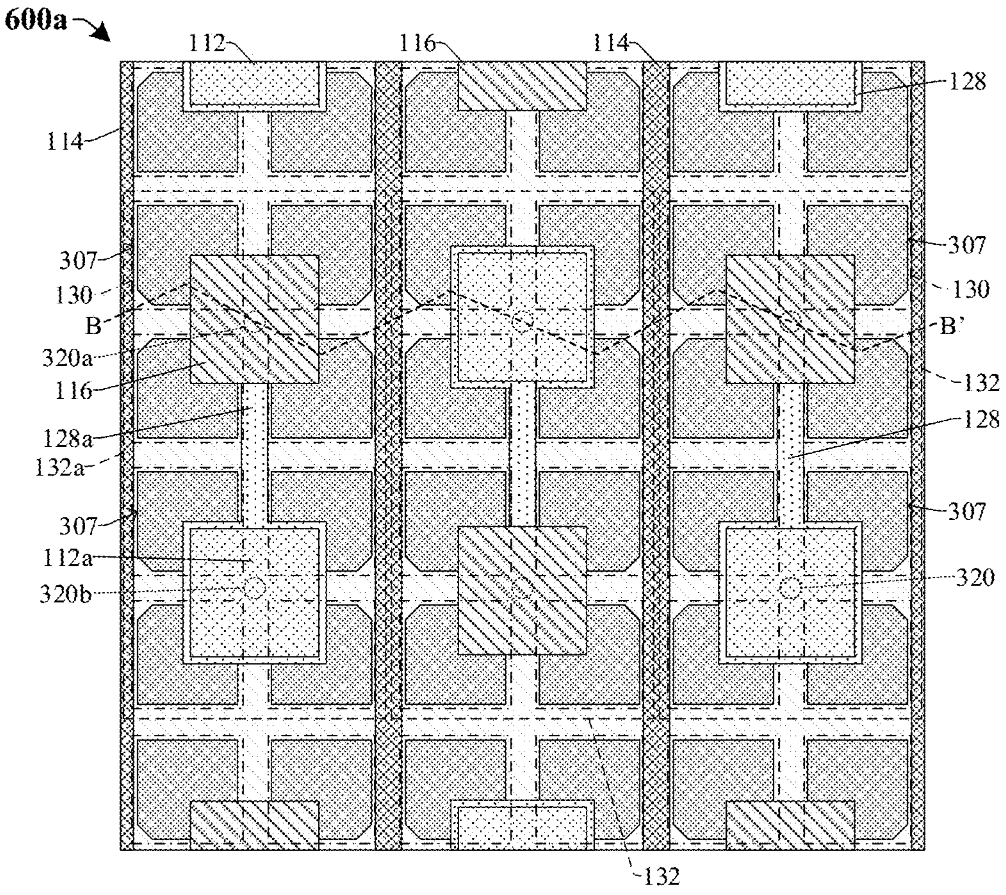
Figure 6B:
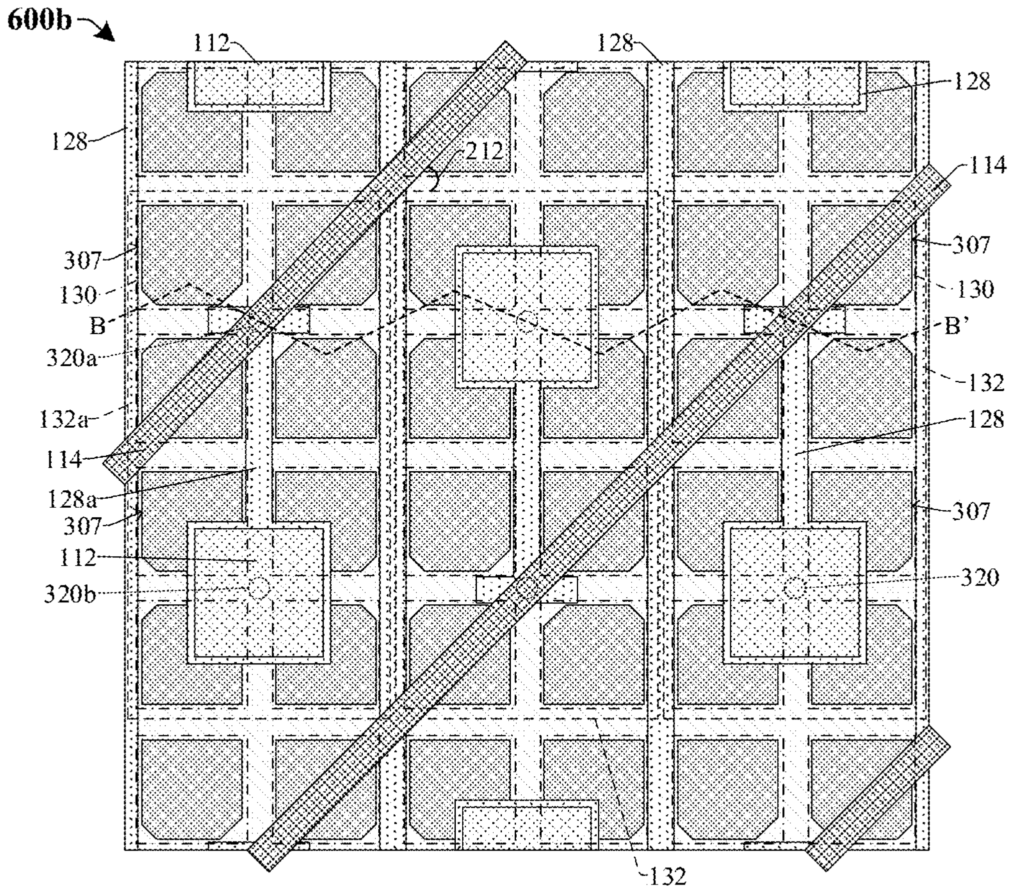
Figure 6C:
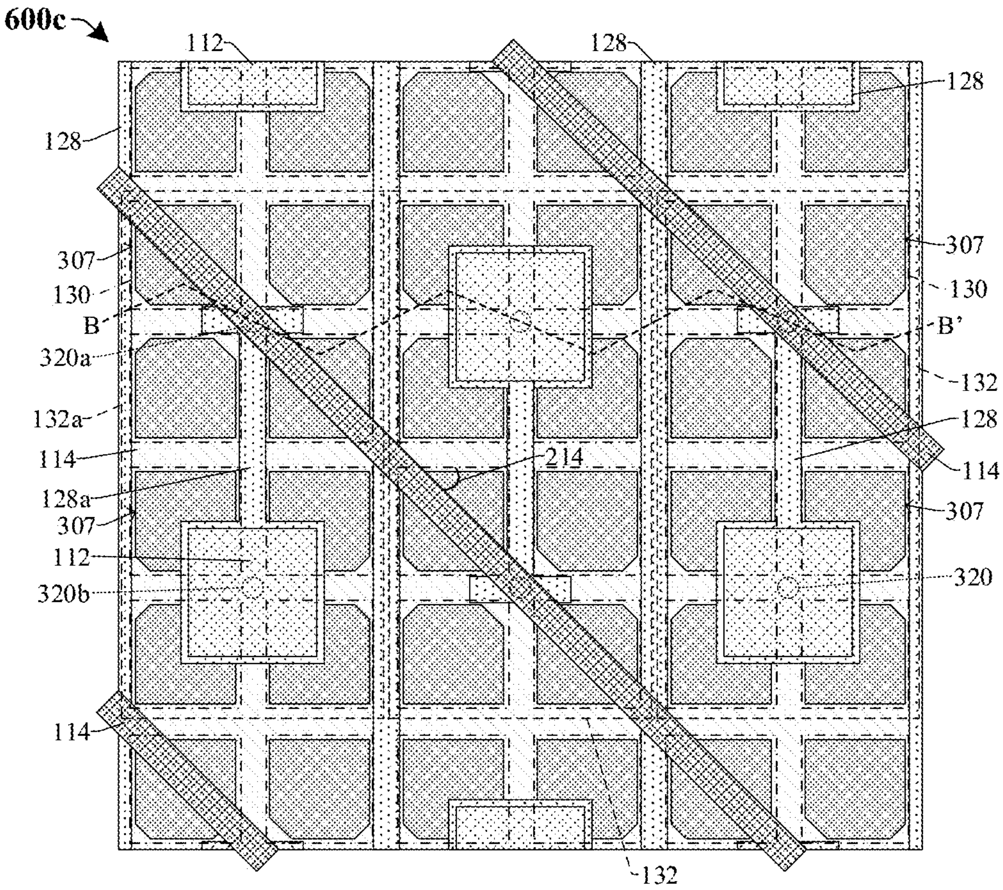

FIGS. 6A-6C illustrate various top views 600*a*-600*c* of some other embodiments of the top view 500*b* of FIG. 5B. FIGS. 6A-6C illustrates the top views 600*a*-600*c* of some embodiments of the stack IC device of FIG. 4A taken along the line B-B'. It will be appreciated that various structures (e.g., portions of the first interconnect structure 304 and the first bond dielectric structure 314 of FIG. 4A) from the cross-sectional view 400*a* of FIG. 4A are omitted from the top views 600*a*-600*c* of FIG. 6A-6C for case of illustration.

As illustrated in the top view 600*a* of FIG. 6A, a single conductive bond pad in the first plurality of conductive bond pads 112 is laterally aligned with an individual floating diffusion node 320 of each pixel 132. For example, the first conductive bond pad 112*a* directly underlies the second floating diffusion node 320*b* of the first pixel 132*a* and is directly electrically coupled to the first and second floating diffusion nodes 320*a*, 320*b* of the first pixel 132*a*. Further, the topmost layer of conductive wires in the plurality of conductive wires 128 comprises a single conductive wire aligned each pixel 132 and configured to electrically couple the first plurality of conductive bond pads 112 to corresponding floating diffusion nodes 320 of each pixel 132. For example, the first conductive wire 128*a* continuously laterally extends from the first floating diffusion node 320*a* to the second floating diffusion node 320*b*. The first conductive wire 128*a* directly electrically couples the first and second floating diffusion nodes 320*a*, 320*b* to the first conductive bond pad 112*a*. Further, for case of illustration, the dummy bond pads 116 are partially transparent to more easily illustrate a layout of the wires 128.

As illustrated in the top view 600*b* of FIG. 6B, in some embodiments, the first plurality of dummy bond pads (116 of FIG. 4A) is omitted. Further, shield structures in the first plurality of shield structures 114 are each elongated at a first angle 212 relative to rows of the plurality of photodetectors 130. In some embodiments, the first angle 212 is 45 degrees, within a range of about 40 degrees to about 50 degrees, or some other suitable value.

As illustrated in the top view 600*c* of FIG. 6C, in some embodiments, the first plurality of dummy bond pads (116 of FIG. 4A) is omitted. Further, shield structures in the first plurality of shield structures 114 are each elongated at a second angle 214 relative to rows of the plurality of photodetectors 130. In some embodiments, the second angle 214 is −45 degrees, within a range of about −40 degrees to about −50 degrees, or some other suitable value.

It will be appreciated that while the top views 400*c*-600*c* of FIGS. 4C-6C illustrate and/or describe a layout of the first bond structure (106 of FIG. 4A), a layout of the second bond structure (108 of FIG. 4A) is symmetrical with the layout of the first bond structure 106 of any of FIGS. 4C-6C. Thus, the second bond structure (108 of FIG. 4A) has a same layout as illustrated and/or described in any one of the top views 400*c*-600*c* of FIGS. 4C-6C.

Figure 7:
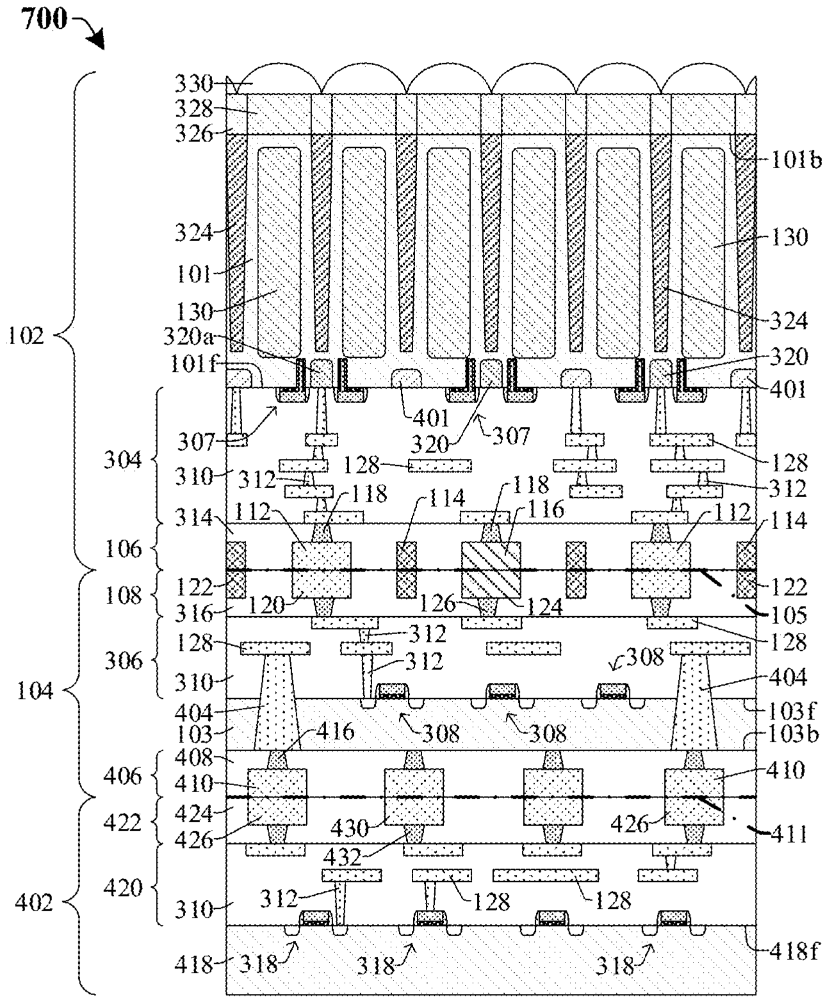
FIGS. 7 and 8 illustrate cross-sectional views of some other embodiments of the stacked IC device of FIG. 4A.

FIG. 7 illustrates a cross-sectional view 700 of some embodiments of a stacked IC device corresponding to some other embodiments of the stacked IC device of FIGS. 4A-4C, where the shield structures (412 and 428 of FIG. 4A) and the dummy bond pads (414 and 430 of FIG. 4A) of the third and fourth bond structures 406, 422 are omitted. Further, the third and fourth bond structures 406, 422 have a same layout that is different from a layout of the first and second bond structures 106, 108.

Figure 8:
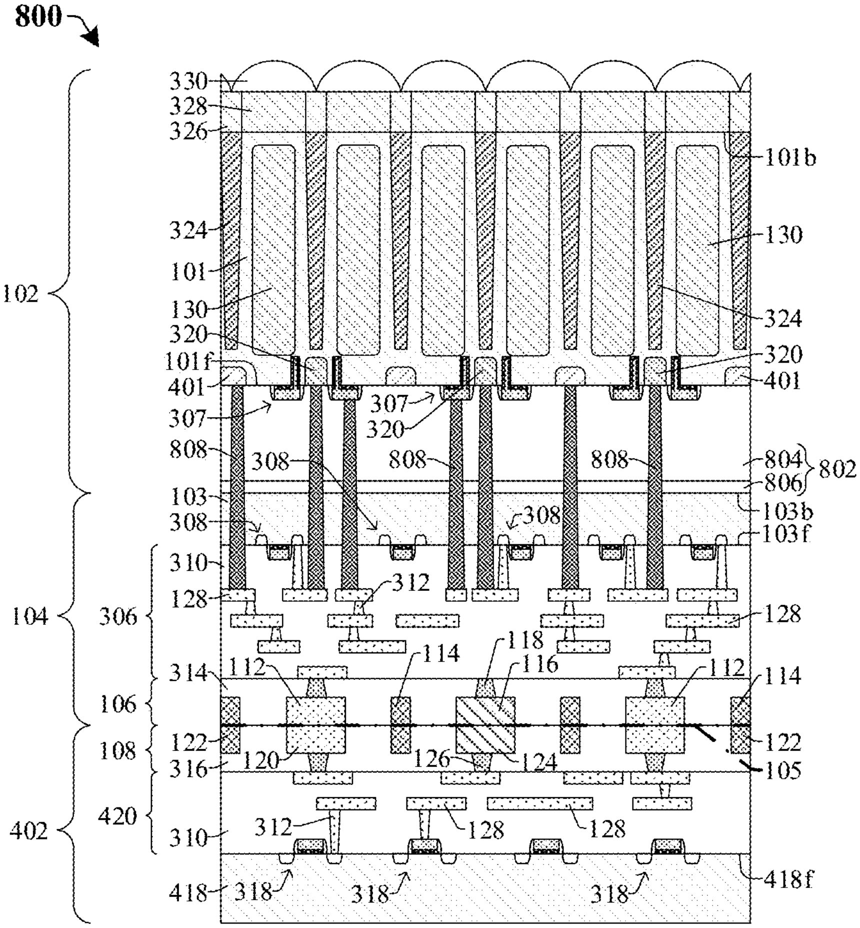

FIG. 8 illustrates a cross-sectional view 800 of some embodiments of a stacked IC device corresponding to some other embodiments of the stacked IC device of FIGS. 4A-4C, where the first interconnect structure (304 of FIG. 4A) and the third and fourth bond structures (406, 422 of FIG. 4A) are omitted.

In various embodiments, as illustrated in FIG. 8, the first IC chip 102 comprises the plurality of photodetectors 130, the first plurality of transistors 307, and a dielectric structure 802. The second IC chip 104 comprises the second plurality of transistors 308, the second interconnect structure 306, and the first bond structure 106. The third IC chip 402 comprises the third plurality of transistors 318, the third interconnect structure 420, and the second bond structure 108. The first bond structure 106 is disposed on the second interconnect structure 306, and the second bond structure is disposed on the third interconnect structure 420. The first and second bond structures 106, 108 meet at the first bond interface. Further, the dielectric structure 802 comprises a first dielectric layer 804 disposed on the front side 101*f* of the first substrate 101 and a second dielectric layer 806 disposed on the first dielectric layer 804. The second dielectric layer 806 is bonded to the back side 103*b* of the second substrate 103. A plurality of through substrate vias (TSVs) 808 continuously extend from conductive wires 128 in the second interconnect structure 306 through the second substrate 103 and the dielectric structure 802 to devices (e.g., the first plurality of transistors 307) and doped regions (e.g., floating diffusion nodes 320 and well regions 401) of the first IC chip 102. The TSVs 808 comprise a conductive material (e.g., copper, aluminum, titanium nitride, tungsten, etc.) and are configured to directly electrically couple the first IC chip 102 to the second IC chip 104. For example, the TSVs 808 directly electrically coupled the floating diffusion nodes 320 to transistors in the second plurality of transistors 308.

Figure 9:
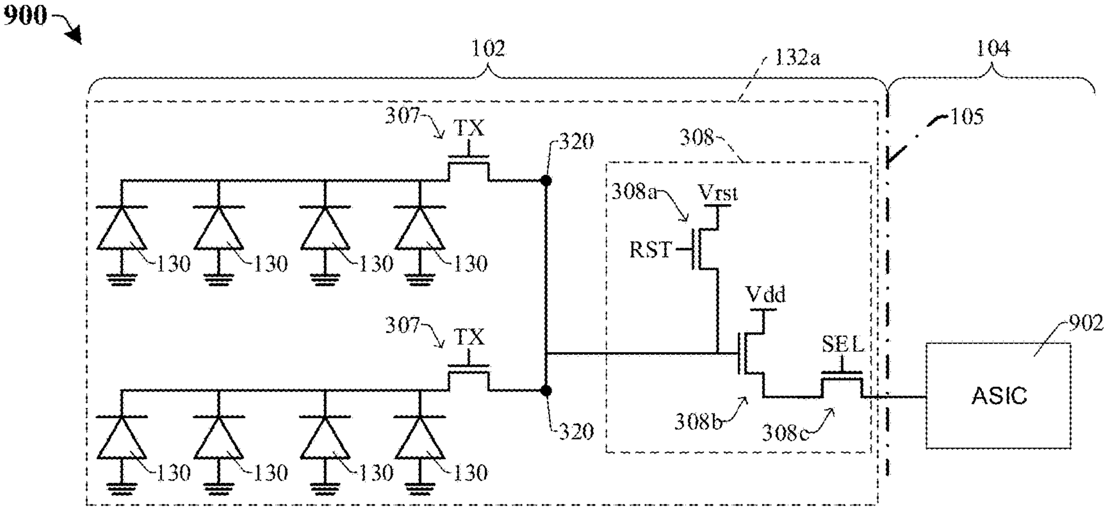
FIG. 9 illustrates a circuit diagram of some embodiments of a stacked IC device comprising a first IC chip electrically coupled to a second IC chip by way of a first bond interface.

FIG. 9 illustrates a circuit diagram 900 of some embodiments of a stacked IC device comprising a first IC chip with a pixel having a 2×4 shared pixel layout bonded to a second IC chip. In some embodiments, the circuit diagram 900 may correspond to some embodiments of the stacked IC device of FIG. 3.

The first IC chip 102 comprises the first pixel 132*a* that has a 2×4 shared pixel layout and comprises the first plurality of transistors 307, photodetectors 130, floating diffusion nodes 320, and the second plurality of transistors 308. It will be appreciated that while the circuit diagram 900 illustrates an individual transistor for each set of four photodetectors 130, the first plurality of transistors 307 has a single transistor coupled between each photodetector 130 and a corresponding floating diffusion node 320. The second IC chip 104 comprises an ASIC 902. In some embodiments, the first IC chip 102 is configured to conduct readout of the photodetectors 130 such that charge accumulated by the photodetectors 130 from incident radiation may be readout as a corresponding electrical signal. The electrical signal may be provided to the ASIC 902 for downstream signal processing. For example, the ASIC 902 may be configured to perform analog-to-digital conversion (ADC), image processing, buffering, the like, or any combination of the foregoing.

The first plurality of transistors 307 are gated by a transfer signal TX and is configured to selectively transfer accumulated charge at the photodetectors 130 to the floating diffusion nodes 320. The second plurality of transistors 308 comprises the reset transistor 308*a*, the source-follower transistor 308*b*, and the select transistor 308*c*. The reset transistor 308*a* is coupled between the floating diffusion nodes 320 and a reset voltage Vrst. The reset transistor 308*a* is gated by a reset signal RST and is configured to selectively electrically couple the floating diffusion nodes 320 to the reset voltage Vrst to reset the floating diffusion nodes 320. Further, the reset transistor 308*a* may be configured to selectively electrically couple the photodetectors 130 to the reset voltage Vrst through coordination with the first plurality of transistors 307.

The source-follower transistor 308*b* is gated by a charge at the floating diffusion nodes 320. For example, a gate of the source-follower transistor 308*b* is directly electrically coupled to the floating diffusion nodes 320. The source-follower transistor 308*b* is coupled between a supply voltage Vdd and a source/drain region of the select transistor 308*c*. The source-follower transistor 308*b* is configured to buffer and/or amplifier a voltage at the floating diffusion nodes 320 for a reading of the voltage. The select transistor 308*c* is configured to selectively pass the buffered and/or amplified voltage from the source-follower transistor 308*b* to an output of the first pixel 132*a*. The output of the first pixel 132*a* is electrically coupled to the ASIC 902 through the first bond interface 105. Further, individual conductive bond pads (112, 120 of FIG. 3) of the first and second bond structures (106, 108 of FIG. 3) are configured to directly electrically coupled the output of the first IC chip 102 to the ASIC 902 at the first bond interface 105. By virtue of shield structures (114, 122 of FIG. 3) being disposed on opposing sides of the individual conductive bond pads (112, 120 of FIG. 3), signal interference from a second output of a second pixel (not shown) (e.g., 132*b* of FIG. 3) to the ASIC 902 at the first bond interface 105 is reduced. As a result, the quality of an image from the first IC chip 102 is increased.

Figure 10A:
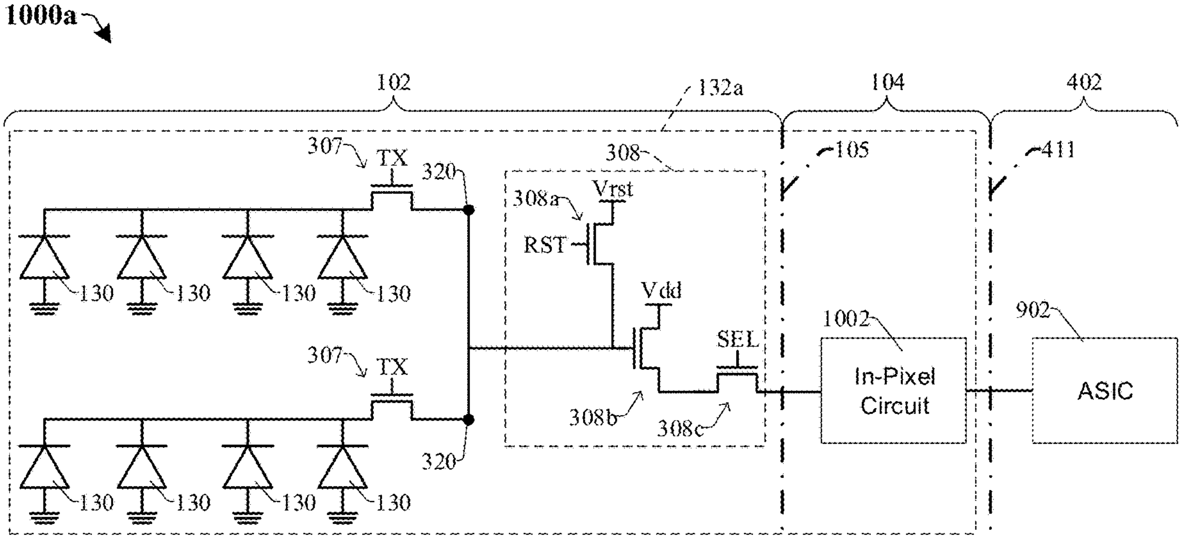
FIGS. 10A-10C illustrate circuit diagrams of some embodiments of a stacked IC device comprising a first IC chip electrically coupled to a second IC chip by way of a first bond interface and a second IC chip electrically coupled to a third IC chip by way of a second bond interface.

FIG. 10A illustrates a circuit diagram 1000*a* of some other embodiments of the stacked IC device of FIG. 9, where the first IC chip 102 comprises the first plurality of transistors 307, the second plurality of transistors 308, and the photodetectors 130, the second IC chip 104 comprises an in-pixel circuit 1002, and the third IC chip 402 comprises the ASIC 902. The first IC chip 102 is electrically coupled to the second IC chip 104 through the first bond interface 105. The second IC chip 104 is electrically coupled to the third IC chip 402 through the second bond interface 411. In some embodiments, the in-pixel circuit 1002 may comprise one or more additional transistors (e.g., logic transistors) and is configured to perform additional processing on the electrical signal from the select transistor 308*c* before passing the electrical signal to the ASIC 902.

Figure 10B:
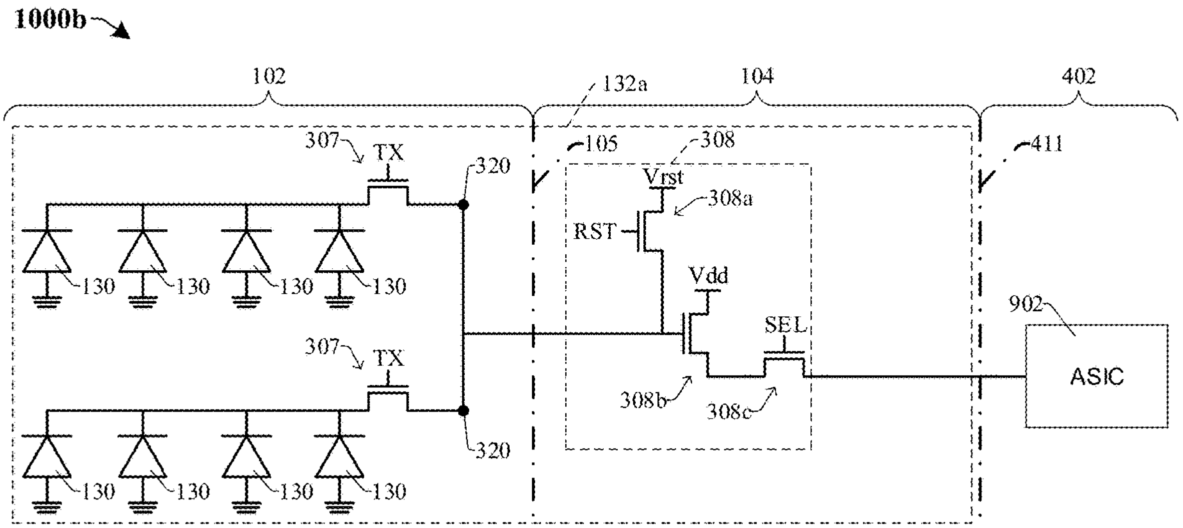

FIG. 10B illustrates a circuit diagram 1000*b* of some embodiments of a stacked IC device comprising a first IC chip with a pixel having a 2×4 shared pixel layout bonded to a second IC chip. In some embodiments, the circuit diagram 1000*b* may correspond to some embodiments of the stacked IC device of FIGS. 4A-4C.

The stacked IC device of FIG. 10B includes the first IC chip 102 comprising the plurality of photodetectors 130, the first plurality of transistors 307, and the plurality of floating diffusion nodes 320, the second IC chip 104 comprises the second plurality of transistors 308, and the third IC chip 402 comprises the ASIC 902. The first IC chip 102 is electrically coupled to the second IC chip 104 through the first bond interface 105. The second IC chip 104 is electrically coupled to the third IC chip 402 through the second bond interface 411.

Figure 10C:
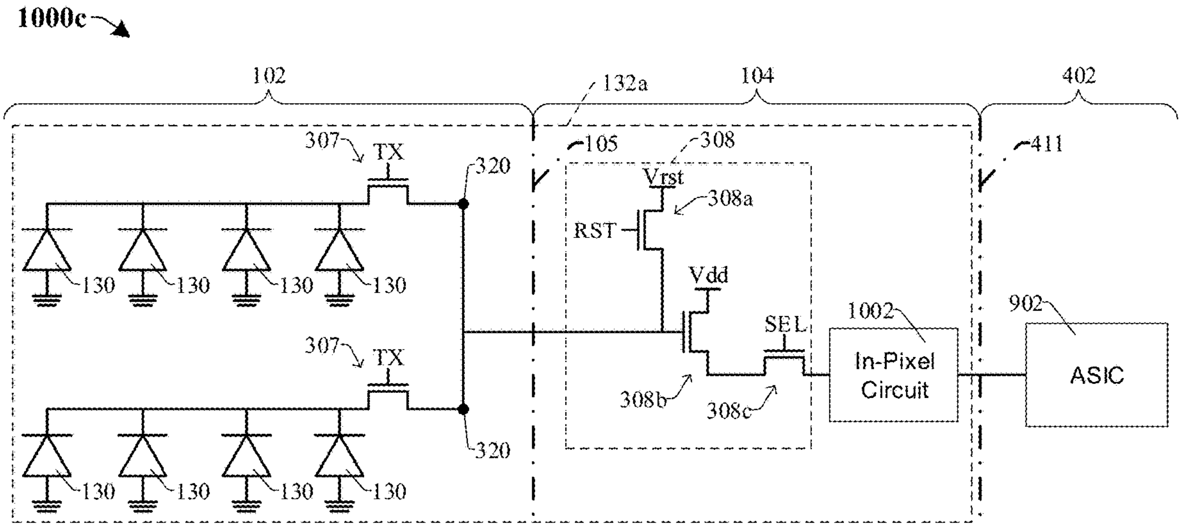

FIG. 10C illustrates a circuit diagram 1000*c* of some other embodiments of the stacked IC device of FIG. 10B, where the second IC chip 104 further comprises the in-pixel circuit 1002 electrically coupled between the second plurality of transistors 308 and the ASIC 902.

FIGS. 11-23 illustrate various cross-sectional views 1100-2300 of some embodiments of a method of forming a stacked IC device comprising bond structures with shield structures. Although the cross-sectional views 1100-2300 shown in FIGS. 11-23 are described with reference to the method, it will be appreciated that the structures shown in FIGS. 11-23 are not limited to the method but rather may stand alone separate of the method. Furthermore, although FIGS. 11-23 are described as a series of acts, it will be appreciated that these acts are not limited in that the order of the acts can be altered in other embodiments, and the methods disclosed are also applicable to other structures. In other embodiments, some acts that are illustrated and/or described may be omitted in whole or in part.

Figure 11:
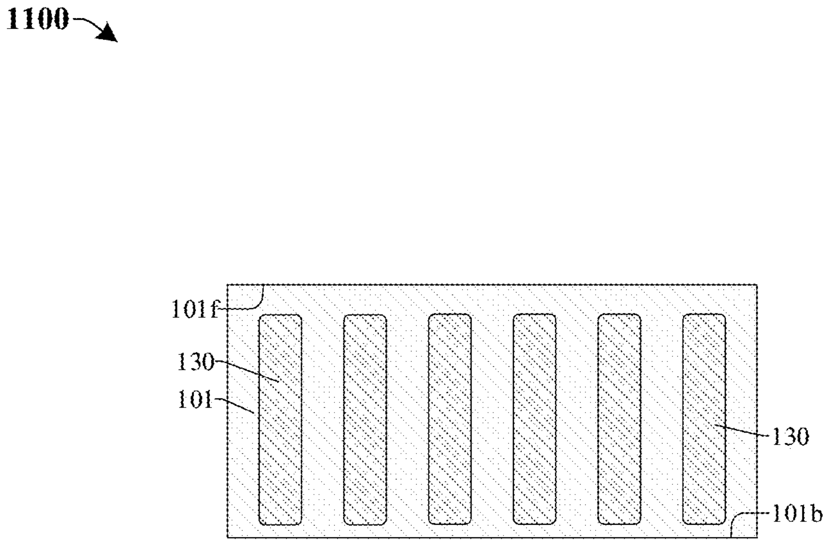
FIGS. 11-23 illustrate various cross-sectional views of some embodiments of a method of forming a stacked IC device comprising bond structures with shield structures.

As shown in cross-sectional view 1100 of FIG. 11, a plurality of photodetectors 130 is formed within a first substrate 101. The first substrate 101 may, for example, be or comprise silicon, monocrystalline silicon, epitaxial silicon, germanium, silicon germanium, another semiconductor material, or the like and may have a first doping type (e.g., p-type). In some embodiments, a process for forming the photodetectors 130 includes performing a selective ion implantation process. The selective ion implantation process may comprise implanting one or more dopants within the first substrate 101 according to a masking layer (not shown). In various embodiments, the photodetectors 130 comprise a second doping type (e.g., n-type) opposite the first doping type (e.g., p-type).

Figure 12:
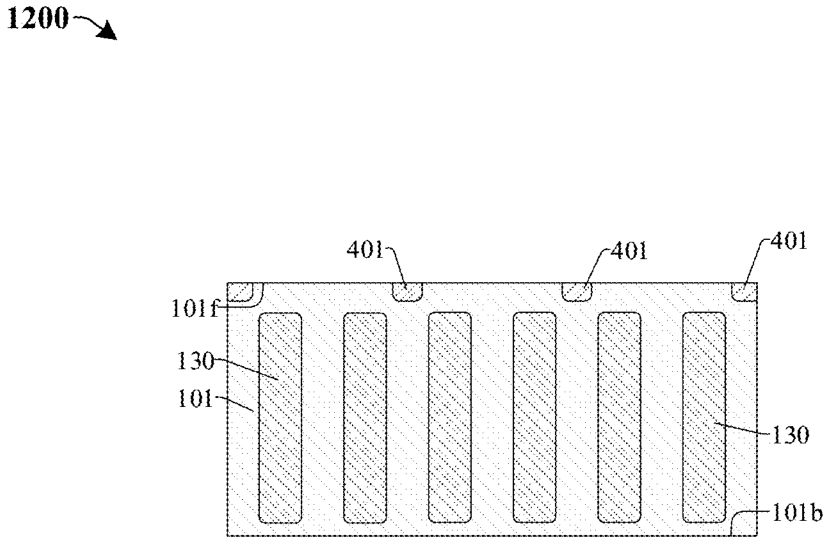

As shown in cross-sectional view 1200 of FIG. 12, a plurality of well regions 401 is formed within the first substrate 101. The well regions 401 comprise the first doping type (e.g., p-type) with a higher doping concentration than adjacent regions of the first substrate 101. In some embodiments, the well regions 401 are formed by a selective ion implantation process.

Figure 13:
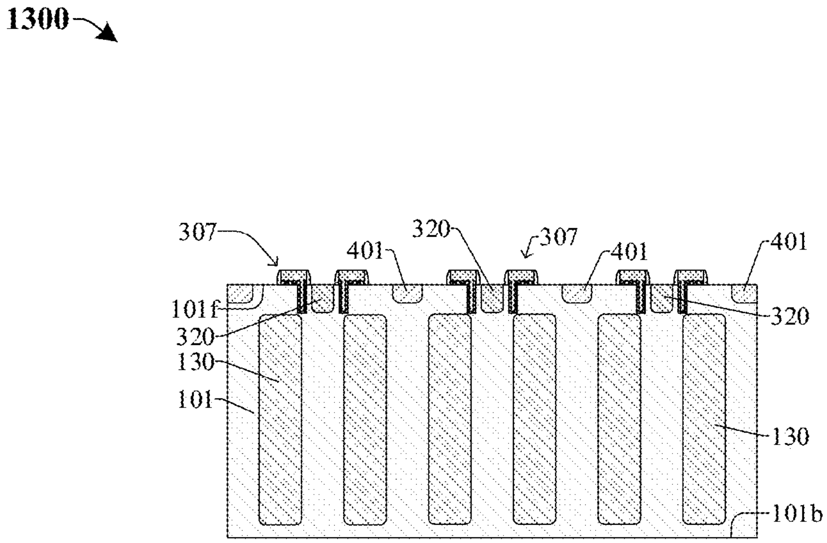

As shown in cross-sectional view 1300 of FIG. 13, a first plurality of transistors 307 and a plurality of floating diffusion nodes 320 are formed on and/or within the front side 101*f* of the first substrate 101. In some embodiments, a process for forming the first plurality of transistors 307 includes: selectively etching the front side 101*f* of the first substrate 101 to form trenches extending into the front side 101*f* of the first substrate 101; depositing (e.g., by physical vapor deposition (PVD), chemical vapor deposition (CVD), atomic layer deposition (ALD), etc.) a gate dielectric over the first substrate 101 and lining the trenches; depositing (e.g., by PVD, CVD, sputtering, electroplating, etc.) a gate electrode over the gate dielectric and in the trenches; performing a patterning process on the gate electrode and the gate dielectric; and forming a sidewall spacer structure along sidewalls of the gate electrode and the gate dielectric. A process for forming the floating diffusion nodes 320 includes selectively implanting one or more dopants within the first substrate 101. The floating diffusion nodes 320 comprise the second doping type (e.g., n-type). In some embodiments, the floating diffusion nodes 320 may be formed after forming the first plurality of transistors 307 such that the floating diffusion nodes 320 may be aligned according to sidewalls of the first plurality of transistors 307.

Figure 14:
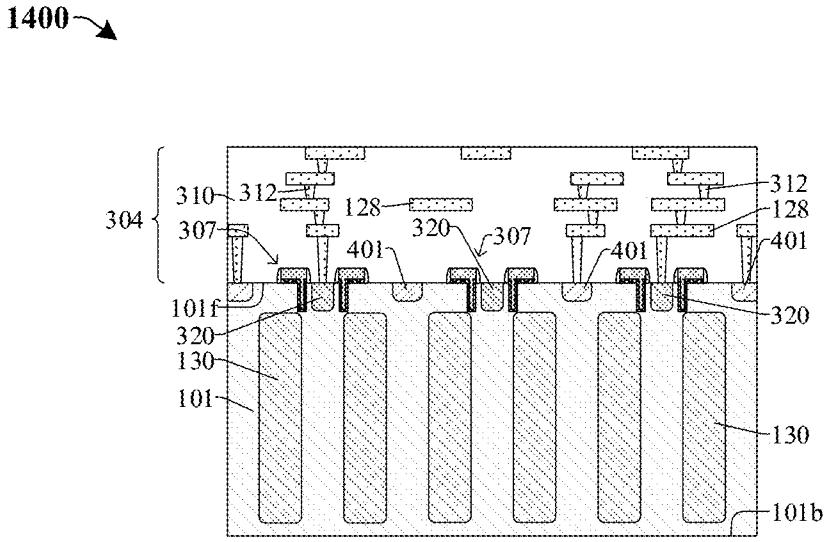

As shown in cross-sectional view 1400 of FIG. 14, a first interconnect structure 304 is formed on the front side 101*f* of the first substrate 101. The first interconnect structure 304 comprises a plurality of conductive wires 128 and a plurality of conductive vias 312 disposed within an interconnect dielectric structure 310. The interconnect dielectric structure 310 may be formed by one or more deposition processes such as PVD process(es), CVD process(es), ALD process(es), other suitable growth and/or deposition process(es), or any combination of the foregoing. In some embodiments, the plurality of conductive vias 312 and the plurality of conductive wires 128 are formed by one or more deposition process(es), one or more patterning process(es), one or more planarization process(es) some other suitable fabrication process(es), or any combination of the foregoing. For example, the plurality of conductive vias 312 and the plurality of conductive wires 128 may be formed by a single damascene process, a dual damascene process, etc.

Figure 15:
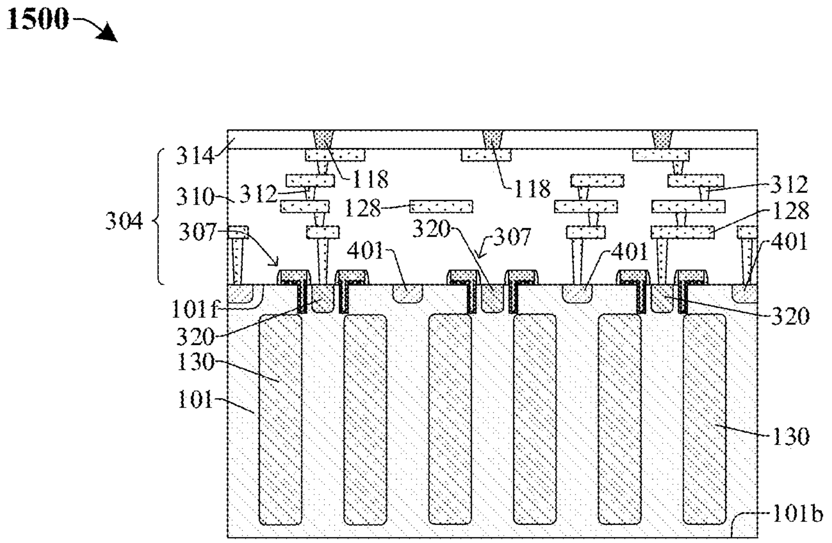

As shown in cross-sectional view 1500 of FIG. 15, a first bond dielectric structure 314 and a first plurality of bond contacts 118 are formed on the first interconnect structure 304. The first bond dielectric structure 314 is formed on the first interconnect structure 304 by a PVD process, a CVD process, an ALD process, or the like. The first bond dielectric structure 314 may, for example, be or comprise silicon oxynitride, silicon dioxide, silicon carbide, some other dielectric material, or any combination of the foregoing. In some embodiments, a process for forming the first plurality of bond contacts 118 includes: forming a masking layer (not shown) on the first bond dielectric structure 314; etching the first bond dielectric structure 314 with the masking layer in place to form a plurality of openings in the first bond dielectric structure 314; depositing (e.g., by CVD, PVD, ALD, sputtering, electroplating, etc.) a conductive material (e.g., copper, aluminum, tungsten, another conductive material, or any combination of the foregoing) within the openings; and performing a planarization process (e.g., a chemical mechanical planarization (CMP) process) on the conductive material.

Figure 16:
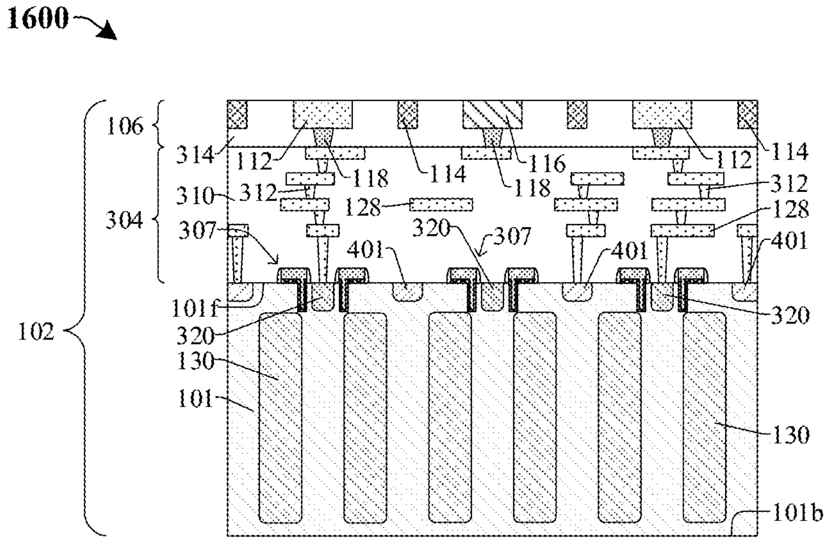

As shown in cross-sectional view 1600 of FIG. 16, a first plurality of conductive bond pads 112, a first plurality of dummy bond pads 116, and a first plurality of shield structures 114 are formed over the first plurality of bond contacts 118, thereby defining a first bond structure 106 and a first IC chip 102. In some embodiments, a process for forming the first plurality of conductive bond pads 112, the first plurality of dummy bond pads 116, and the first plurality of shield structures 114 includes: depositing (e.g., by CVD, PVD, ALD, etc.) a first dielectric layer on the first plurality of bond contacts 118; forming a masking layer over the first dielectric layer; etching the first dielectric layer according to the masking layer to form a plurality of bond feature openings within the first dielectric layer; performing a deposition process to deposit the conductive bond pads 112, the dummy bond pads 116, and the shield structures 114 within the bond feature openings; and performing a planarization process (e.g., a CMP process) on the conductive bond pads 112, the dummy bond pads 116, and the shield structures 114. The first dielectric layer is part of the first bond dielectric structure 314 and may, for example, be or comprise silicon oxynitride, silicon dioxide, silicon carbide, some other dielectric material, or any combination of the foregoing.

In yet further embodiments, the deposition process includes: performing a first deposition (e.g., CVD, PVD, ALD, electroplating, electroless plating, etc.) to deposit a conductive bond pad material (e.g., copper, aluminum, tungsten, etc.) in first openings of the plurality of bond feature openings that correspond to the first plurality of conductive bond pads 112; performing a second deposition (e.g., CVD, PVD, ALD, electroplating, electroless plating, etc.) to deposit a dummy bond pad material (e.g., a metal material such as copper, aluminum, tungsten, or a dielectric material such as silicon dioxide, silicon nitride, a metal oxide, etc.) in second openings of the plurality of bond feature openings that correspond to the first plurality of dummy bond pads 116; and performing a third deposition (e.g., CVD, PVD, ALD, electroplating, electroless plating, etc.) to deposit a shield structure material (e.g., a metal material such as copper, aluminum, tungsten, or a dielectric material such as silicon dioxide, a low-k dielectric material, etc.) in third openings of the plurality of bond feature openings that correspond to the first plurality of shield structures 114. In some embodiments, the first deposition and the second deposition are the same and are different from the third deposition.

In various embodiments, the first plurality of conductive bond pads 112, the first plurality of dummy bond pads 116, and the first plurality of shield structures 114 comprise a same conductive material (e.g., copper, aluminum, tungsten, etc.). In yet further embodiments, the first plurality of shield structures 114 comprises a dielectric material (e.g., silicon dioxide, a low-k dielectric material, etc.) different from a conductive material (e.g., copper, aluminum, tungsten, etc.) of the first plurality of conductive bond pads 112. In some embodiments, the first plurality of conductive bond pads 112, the first plurality of dummy bond pads 116, and the first plurality of shield structures 114 are formed concurrently with one another. Further, the first bond structure 106 may be formed such that the first bond structure 106 may have a top view or layout as illustrated and/or described in any one of FIG. 1B, 2A-2D, 5B, or 6A-6C. For example, the first bond structure 106 may be formed such that the first plurality of dummy bond pads 116 are omitted as illustrated and/or described in FIG. 2B, 2C, 2D, 6B, or 6C.

Figure 17:
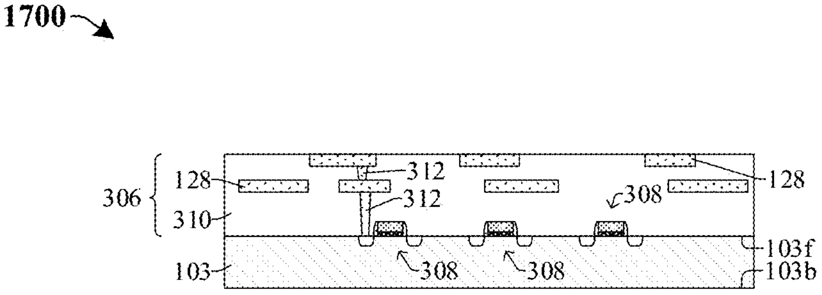

As shown in cross-sectional view 1700 of FIG. 17, a second substrate 103 is provided and a second plurality of transistors 308 and a second interconnect structure 306 are formed on a front side 103*f* of the second substrate 103. In some instances, the second plurality of transistors 308 and the second interconnect structure 306 are formed by process(es) substantially similar to process(es) described above regarding formation of the structure of the cross-sectional views of 1300 and 1400 of FIGS. 13 and 14.

Figure 18:
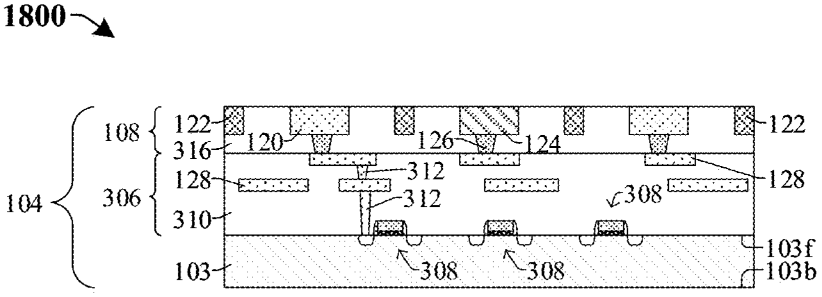

As shown in cross-sectional view 1800 of FIG. 18, a second bond structure 108 is formed on the second interconnect structure 306, thereby forming a second IC chip 104. In some embodiments, the second bond structure 108 comprises a second plurality of conductive bond pads 120, a second plurality of dummy bond pads 124, a second plurality of bond contacts 126, and a second plurality of shield structures 122 disposed within a second bond dielectric structure 316. In various embodiments, the second bond structure 108 is formed by process(es) substantially similar to process(es) described above regarding formation of the first bond structure 106 (e.g., as illustrated and/or described in FIGS. 15 and 16). Further, the second bond structure 108 is formed such that a layout of the second bond structure 108 is the same as and/or symmetrical to a layout of the first bond structure 106.

Figure 19:
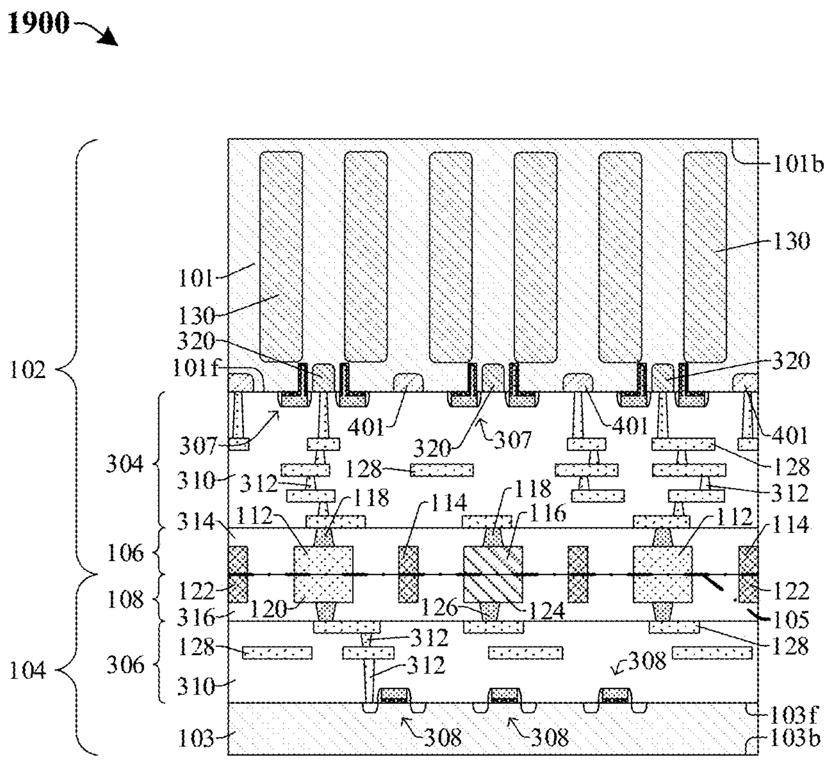

As shown in cross-sectional view 1900 of FIG. 19, the first IC chip 102 is bonded to the second IC chip 104. Bonding the first IC chip 102 to the second IC chip 104 includes: flipping the first IC chip 102 and aligning the first IC chip 102 with the second IC chip 104; applying pressure to the first and/or second IC chips 102, 104; and performing an annealing process on the first and second IC chips 102, 104 to form the first bond interface 105. The first bond interface 105 comprises dielectric-to-dielectric bonds and conductor-to-conductor bonds.

Figure 20:
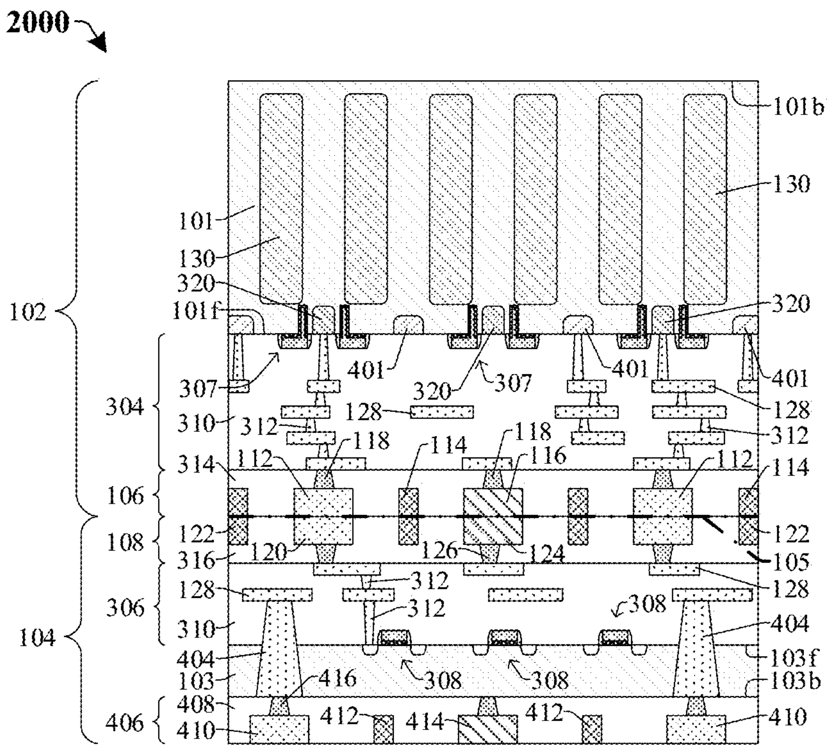

As shown in cross-sectional view 2000 of FIG. 20, a plurality of through substrate vias (TSVs) 404 and a third bond structure 406 are formed on and/or within the second substrate 103. The TSVs 404 continuously extend through the second substrate 103 and electrically couple the third bond structure 406 to the second interconnect structure 306. In some embodiments, the third bond structure 406 comprises a third plurality of conductive bond pads 410, a third plurality of dummy bond pads 414, a third plurality of bond contacts 416, and a third plurality of shield structures 412 disposed within a third bond dielectric structure 408. In various embodiments, the third bond structure 406 is formed by process(es) substantially similar to process(es) described above regarding formation of the first bond structure 106 (e.g., as illustrated and/or described in FIGS. 15 and 16).

Figure 21:
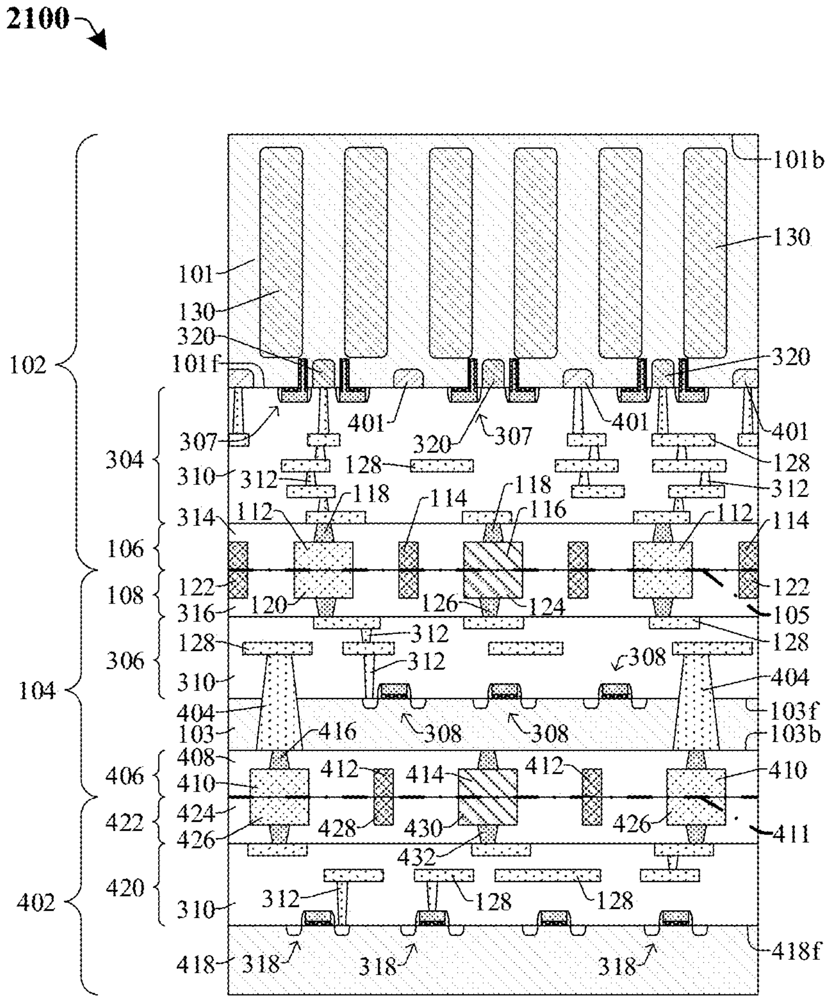

As shown in cross-sectional view 2100 of FIG. 21, the first and second IC chips 102, 104 are bonded to the third IC chip 402. In some embodiments, bonding the third IC chip 402 to the first and second IC chips 102, 104 includes: aligning the third IC chip 402 with the first and second IC chips 102, 104; applying pressure to the first and second chips 102, 104 and/or the third chip 402; and performing an annealing process to form the second bond interface 411 between the second and third IC chips 104, 402.

Figure 22:
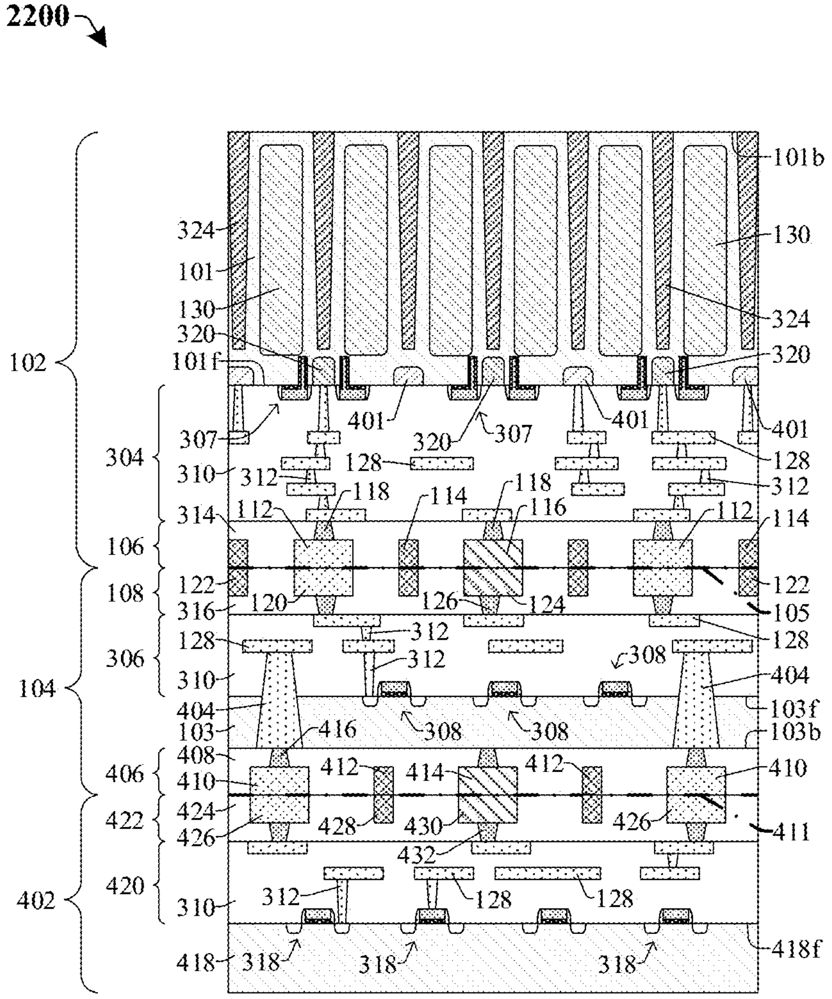

As shown in cross-sectional view 2200 of FIG. 22, an isolation structure 324 is formed extending into a back side 101*b* of the first substrate 101. In some embodiments, a process for forming the isolation structure 324 includes: selectively etching the back side 101*b* of the first substrate 101 to form a trench disposed between adjacent photodetectors 130; depositing (e.g., by CVD, PVD, ALD, etc.) an isolation structure material within the trench and over the first substrate 101; and performing a planarization process (e.g., a CMP process, an etching process, etc.) on the isolation structure material.

Figure 23:
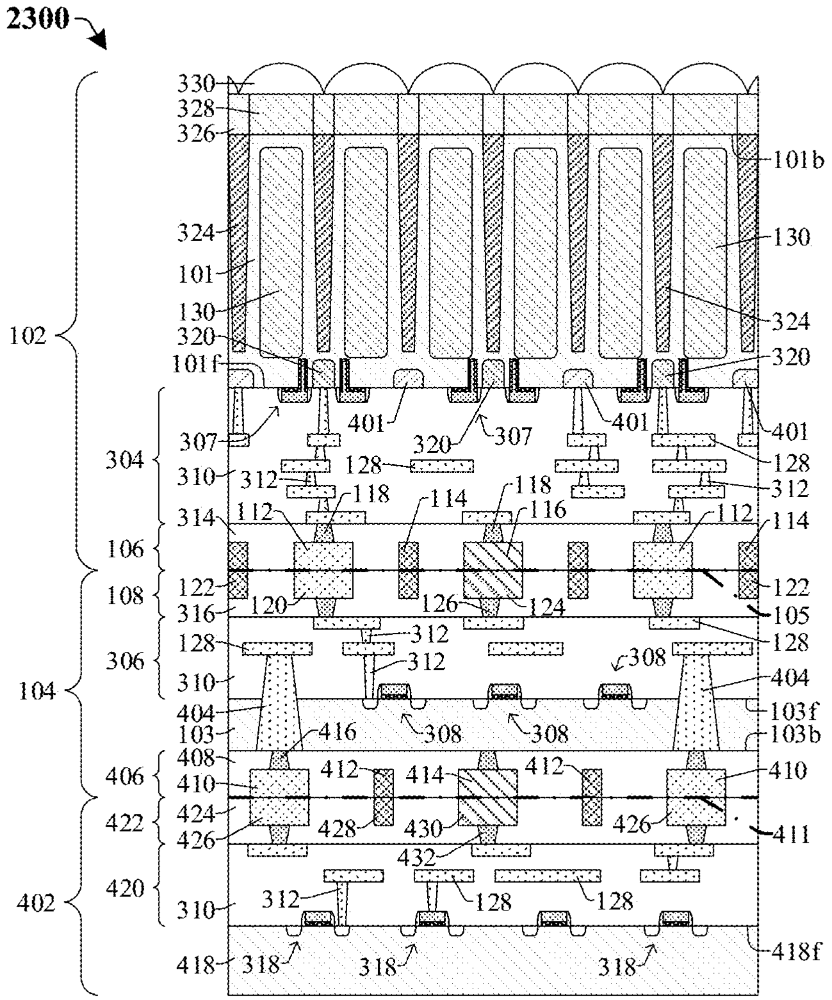

As shown in cross-sectional view 2300 of FIG. 23, a grid structure 326, a plurality of light filters 328, and a plurality of micro-lenses 330 are formed on the back side 101*b* of the first substrate 101. The grid structure 326 is formed by depositing a grid material over the first substrate 101 and patterning the grid material to form the grid structure 326. The light filters 328 may be formed by depositing and patterning respective color filter layers corresponding to the light filters 328. The micro-lenses 330 are formed by depositing a micro-lens material over the light filters 328 and patterning the micro-lens material to form the plurality of micro-lenses 330.

Figure 24:
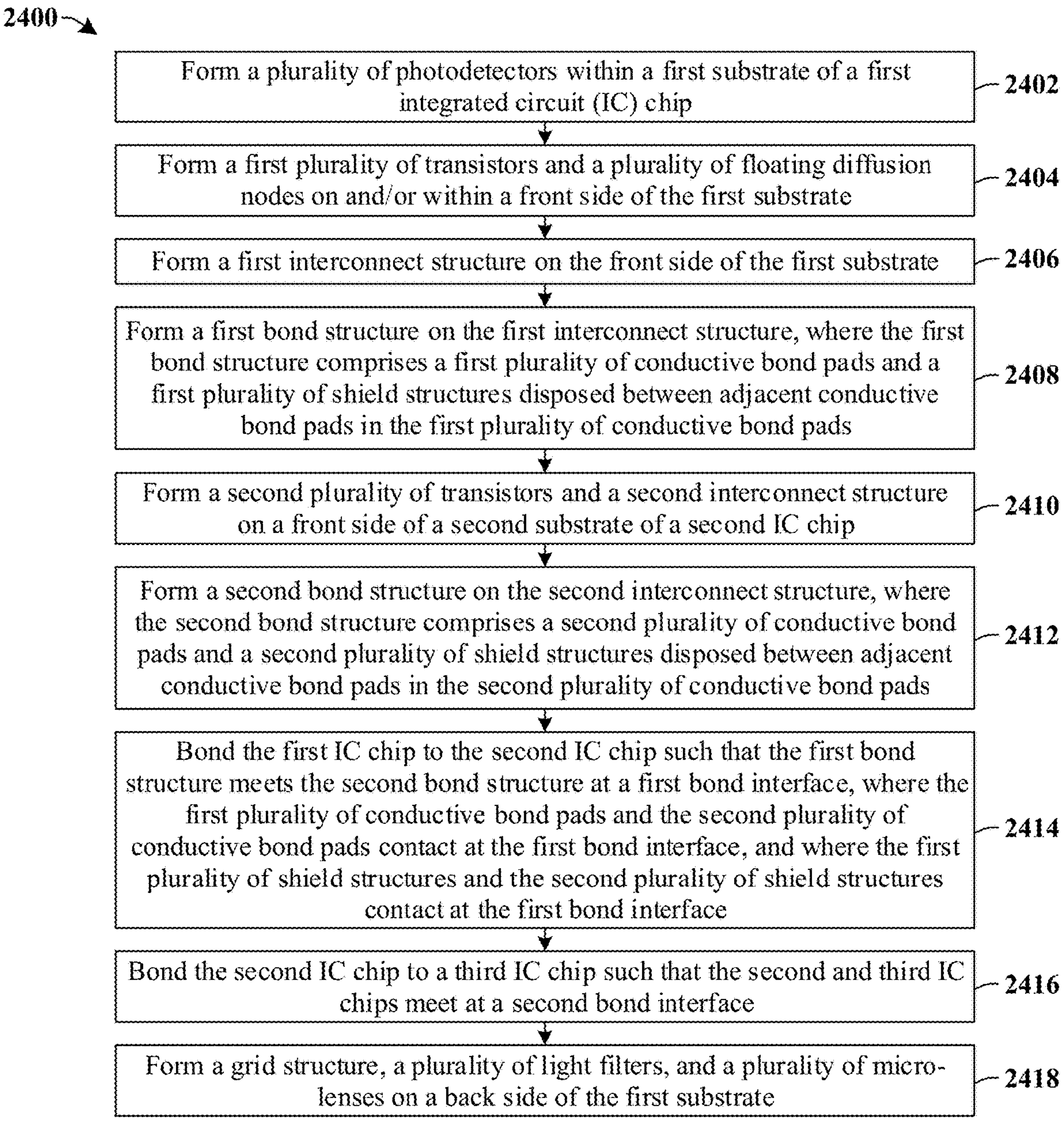
FIG. 24 illustrates a flowchart according to some embodiments of a method for forming a stacked IC device comprising bond structures with shield structures.

FIG. 24 illustrates some embodiments of a method 2400 of forming a stacked IC device comprising bond structures with shield structures. Although the method 2400 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 2402, a plurality of photodetectors is formed within a first substrate of a first integrated circuit (IC) chip. FIG. 11 illustrates a cross-sectional view 1100 corresponding to some embodiments of act 2402.

At act 2404, a first plurality of transistors and a plurality of floating diffusion nodes are formed on and/or within a front side of the first substrate. FIG. 13 illustrates a cross-sectional view 1300 corresponding to some embodiments of act 2404.

At act 2406, a first interconnect structure is formed on the front side of the first substrate. FIG. 14 illustrates a cross-sectional view 1400 corresponding to some embodiments of act 2406.

At act 2408, a first bond structure is formed on the first interconnect structure. The first bond structure comprises a first plurality of conductive bond pads and a first plurality of shield structures disposed between adjacent conductive bond pads in the first plurality of conductive bond pads. FIGS. 15 and 16 illustrate cross-sectional views 1500 and 1600 corresponding to some embodiments of act 2408.

At act 2410, a second plurality of transistors and a second interconnect structure are formed on a front side of a second substrate of a second IC chip. FIG. 17 illustrates a cross-sectional view 1700 corresponding to some embodiments of act 2410.

At act 2412, a second bond structure is formed on the second interconnect structure. The second bond structure comprises a second plurality of conductive bond pads and a second plurality of shield structures disposed between adjacent conductive bond pads in the second plurality of conductive bond pads. FIG. 18 illustrates a cross-sectional view 1800 corresponding to some embodiments of act 2412.

At act 2414, the first IC chip is bonded to the second IC chip such that the first bond structure meets the second bond structure at a first bond interface. The first plurality of conductive bond pads and the second plurality of conductive bond pads contact at the first bond interface. The first plurality of shield structures and the second plurality of shield structures contact at the first bond interface. FIG. 19 illustrates a cross-sectional view 1900 corresponding to some embodiments of act 2414.

At act 2416, the second IC chip is bonded to a third IC chip such that the second and third IC chips meet at a second bond interface. FIG. 21 illustrates a cross-sectional view 2100 corresponding to some embodiments of act 2416.

At act 2418, a grid structure, a plurality of light filters, and a plurality of micro-lenses are formed on a back side of the first substrate. FIG. 23 illustrates a cross-sectional view 2300 corresponding to some embodiments of act 2418.

Accordingly, in some embodiments, the present disclosure relates to a stacked IC device comprises a first IC chip with a first bond structure bonded to a second bond structure of a second IC chip, where the first and second bond structures respectively comprise shield structures disposed between adjacent conductive bond pads.

In some embodiments, the present application provides an integrated circuit (IC) including: a first IC chip comprising a first bond structure, wherein the first bond structure comprises a first plurality of conductive bond pads and a first plurality of shield structures disposed between adjacent conductive bond pads among the first plurality of conductive bond pads; and a second IC chip comprising a second bond structure, wherein a bonding interface is disposed between the first bond structure and the second bond structure, wherein the second bond structure comprises a second plurality of conductive bond pads and a second plurality of shield structures, wherein the first plurality of conductive bond pads contacts the second plurality of conductive bond pads and the first plurality of shield structures contacts the second plurality of shield structures at the bonding interface.

In some embodiments, the present application provides a semiconductor structure including: a first integrated circuit (IC) chip comprising a first substrate, a first bond structure, and a first pixel in the first substrate, wherein the first pixel comprises a first plurality of photodetectors disposed around a first floating diffusion node and a second plurality of photodetectors disposed around a second floating diffusion node; a second IC chip comprising a second substrate and a second bond structure over the second substrate, wherein the first bond structure contacts the second bond structure; and wherein the first bond structure comprises a first plurality of conductive bond pads and a first plurality of shield structures, wherein the first plurality of conductive bond pads comprises a first conductive bond pad directly underlying the first floating diffusion node, wherein the first plurality of shield structures comprises a first shield structure and a second shield structure disposed on opposing sides of the first conductive bond pad.

In various embodiments, the present application provides a method for forming an integrated circuit (IC), the method including: forming a plurality of photodetectors within a first substrate; forming a first interconnect structure on a front side of the first substrate; forming a first bond structure on the first interconnect structure, wherein the first bond structure comprises a first plurality of conductive bond pads and a first plurality of shield structures disposed between adjacent conductive bond pads among the first plurality of conductive bond pads; forming a second interconnect structure on a front side of a second substrate; forming a second bond structure on the second interconnect structure, wherein the second bond structure comprises a second plurality of conductive bond pads and a second plurality of shield structures disposed between adjacent conductive bond pads in the second plurality of conductive bond pads, and wherein a layout of the second bond structure is symmetrical with a layout of the first bond structure; and bonding the first bond structure to the second bond structure at a first bond interface.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated circuit (IC), the method comprising:

forming a plurality of photodetectors within a first substrate;

forming a first interconnect structure on a front side of the first substrate;

forming a first bond structure on the first interconnect structure, wherein the first bond structure comprises a first plurality of conductive bond pads and a first plurality of shield structures disposed between adjacent conductive bond pads among the first plurality of conductive bond pads, wherein a width of a first shield structure of the first plurality of shield structures is less than a width of a first conductive bond pad of the first plurality of conductive bond pads, wherein a length of the first shield structure is greater than a length of the first conductive bond pad;

forming a second interconnect structure on a front side of a second substrate;

forming a second bond structure on the second interconnect structure, wherein the second bond structure comprises a second plurality of conductive bond pads and a second plurality of shield structures disposed between adjacent conductive bond pads in the second plurality of conductive bond pads, and wherein a layout of the second bond structure is symmetrical with a layout of the first bond structure; and bonding the first bond structure to the second bond structure at a first bond interface.

2. The method of claim 1, wherein the first bond structure further comprises a first plurality of dummy bond pads disposed alternatingly with the first plurality of conductive bond pads, wherein the second bond structure further comprises a second plurality of dummy bond pads disposed alternatingly with the second plurality of conductive bond pads, wherein the first plurality of dummy bond pads directly contact the second plurality of dummy bond pads.

3. The method of claim 1, further comprising:

forming a plurality of through substrate vias (TSVs) in the second substrate;

forming a third bond structure on a back side of the second substrate, wherein the third bond structure is electrically coupled to the second interconnect structure by way of the TSVs;

forming a third interconnect structure on a front side of a third substrate;

forming a fourth bond structure on the third interconnect structure; and bonding the third bond structure to the fourth bond structure.

4. The method of claim 3, wherein the third bond structure comprises a third plurality of conductive bond pads and a third plurality of shield structures disposed between adjacent conductive bond pads in the third plurality of conductive bond pads, wherein the fourth bond structure comprises a fourth plurality of conductive bond pads and a fourth plurality of shield structures disposed between adjacent conductive bond pads in the fourth plurality of conductive bond pads, wherein a layout of the third bond structure is symmetrical with a layout of the fourth bond structure.

5. The method of claim 1, further comprising:

performing an ion implantation process to form a first floating diffusion node in the first substrate; and forming a first transistor on the front side of the second substrate, wherein the first transistor comprises a gate electrode over a gate dielectric, wherein the first and second bond structures directly electrically couple the first floating diffusion node to the gate electrode of the first transistor.

6. The method of claim 1, wherein forming the first bond structure comprises:

depositing a first bond dielectric structure over the first interconnect structure;

etching the first bond dielectric structure to form a first plurality of openings and a second plurality of openings in the first bond dielectric structure;

depositing a conductive bond pad material in the first plurality of openings;

depositing a shield structure material in the second plurality of openings; and performing a planarization process on the conductive bond pad material and the shield structure material.

7. The method of claim 6, wherein the shield structure material is a dielectric material different from that of the first bond dielectric structure.

8. The method of claim 1, wherein the first plurality of conductive bond pads and the first plurality of shield structures are formed concurrently.

9. The method of claim 1, wherein the length of the first shield structure is greater than the width of the first conductive bond pad.

10. A method for forming an integrated circuit (IC), the method comprising:

forming a first plurality of semiconductor devices on a first surface of a first substrate;

forming a first bond structure on the first surface of the first substrate, wherein forming the first bond structure comprises:

depositing a dielectric structure on the first surface of the first substrate;

performing a first etch process on the dielectric structure to form a first plurality of openings and a second plurality of openings in the dielectric structure;

forming a first plurality of conductive bond pads in the first plurality of openings; and forming a first plurality of shield structures in the second plurality of openings, wherein the first plurality of shield structures are interposed between neighboring conductive bond pads of the first plurality of conductive bond pads, wherein a first shield structure of the first plurality of shield structures is between a first pair of conductive bond pads of the first plurality of conductive bond pads and has a length greater than a distance between the first pair of conductive bond pads;

forming a second plurality of semiconductor devices on a first surface of a second substrate;

forming a second bond structure on the first surface of the second substrate; and bonding the first substrate to the second substrate, wherein a bond interface is between the first bond structure and the second bond structure.

11. The method of claim 10, wherein a top surface of the first shield structure is aligned with a top surface of the first pair of conductive bond pads and a bottom surface of the first shield structure is aligned with a bottom surface of the first pair of conductive bond pads.

12. The method of claim 10, wherein the first plurality of conductive bond pads comprises a second pair of conductive bond pads laterally offset from the first pair of conductive bond pads in a first direction, wherein the first shield structure is elongated in the first direction, wherein a second shield structure of the first plurality of shield structures is elongated in a second direction substantially orthogonal to the first direction, wherein the second shield structure is arranged between the first pair of conductive bond pads and the second pair of conductive bond pads.

13. The method of claim 12, wherein the first shield structure contacts the second shield structure.

14. The method of claim 10, wherein the second bond structure comprises a second plurality of conductive bond pads contacting the first plurality of conductive bond pads and a second plurality of shield structures contacting the first plurality of shield structures.

15. The method of claim 10, wherein the first plurality of shield structures comprise a dielectric material having a dielectric constant less than that of the dielectric structure.

16. A method for forming an integrated circuit (IC), the method comprising:

forming a plurality of photodetectors in a first substrate of a first IC chip, wherein the plurality of photodetectors comprises a first photodetector subarray and a second photodetector subarray adjacent to the first photodetector subarray;

implanting dopants into the first substrate to form a first floating diffusion node and a second floating diffusion node in the first substrate, wherein photodetectors of the first photodetector subarray are adjacent to the first floating diffusion node and photodetectors of the second photodetector subarray are adjacent to the second floating diffusion node;

forming a first bond structure on the first substrate, wherein the first bond structure comprises a first plurality of conductive bond pads and a first plurality of shield structures in a first bond dielectric, wherein the first plurality of conductive bond pads comprises a first conductive bond pad at least partially laterally aligned with the first photodetector subarray, wherein the first conductive bond pad is electrically coupled to the first floating diffusion node and the second floating diffusion node, and wherein the first conductive bond pad is spaced between a pair of neighboring shield structures of the first plurality of shield structures;

forming a second bond structure on a second substrate of a second IC chip, wherein the second bond structure comprises a second plurality of conductive bond pads and a second plurality of shield structures in a second bond dielectric; and bonding the first IC chip to the second IC chip at a bond interface, wherein the first plurality of conductive bond pads and the first plurality of shield structures are bonded, respectively, to the second plurality of conductive bond pads and the second plurality of shield structures at the bond interface.

17. The method of claim 16, further comprising:

forming an interconnect structure between the first bond structure and the first substrate, wherein the interconnect structure comprises a plurality of conductive wires and a plurality of conductive vias in an interconnect dielectric, wherein a first wire in the plurality of conductive wires comprises a first segment under the first conductive bond pad and a second segment under the second floating diffusion node in a top view, wherein an area of the first segment is greater than an area of the second segment.

18. The method of claim 17, wherein the first and second segments of the first wire are spaced between the pair of neighboring shield structures.

19. The method of claim 16, wherein the bond interface comprises conductor-to-conductor bonds between the first plurality of conductive bond pads and the second plurality of conductive bond pads, and dielectric-to-dielectric bonds between the first plurality of shield structures and the second plurality of shield structures.

20. The method of claim 16, wherein the first plurality of shield structures comprise first shield structures elongated in a first direction and second shield structures elongated in a second direction substantially orthogonal to the first direction, wherein the first and second shield structures form a shielding grid structure that laterally encloses outer perimeters of the conductive bond pads in the first plurality of conductive bond pads.

* * * * *